United States Patent [19]

Bohley et al.

[11] Patent Number: 4,940,979
[45] Date of Patent: Jul. 10, 1990

[54] COMBINED RATE/WIDTH MODULATION ARRANGEMENT

[75] Inventors: Thomas K. Bohley; Grosvenor H. Garnett, both of Colorado Springs; Christopher Koerner, Longmont; Charles E. Moore, Loveland, all of Colo.

[73] Assignee: Hewlett-Packard Company, Palo Alto, Calif.

[21] Appl. No.: 186,430

[22] Filed: Apr. 26, 1988

[51] Int. Cl.⁵ .............................................. H03M 1/82
[52] U.S. Cl. ...................................... 341/152; 341/145
[58] Field of Search ......................... 341/120, 145, 152

[56] References Cited

U.S. PATENT DOCUMENTS

| 3,754,233 | 8/1973 | Sutherland | 341/152 |
| 4,095,218 | 6/1978 | Crouse | 341/152 |
| 4,096,475 | 6/1978 | Ong | 341/145 |

OTHER PUBLICATIONS

H. Schmid, Electronic Analog Digital Conversion, Van Nostrand Reinhold, NY, 1970, chapter 7, pp. 165–229.

*Primary Examiner*—William M. Shoop, Jr.
*Assistant Examiner*—Marc S. Hoff
*Attorney, Agent, or Firm*—Karl E. Bring

[57] ABSTRACT

Pulse modulation circuitry which receives n binary data bits and generates a rate/width pulse modulated signal representing the binary value of the received data bits. The lower order m of the n bits generate a rate modulated signal having a number of pulses equal to the binary value of the m bits. The remainder of the n bits width modulate the rate modulated pulses. Each least significant bit increase in the binary value of the received date bits increases the width of a rate modulated pulse by a predetermined amount.

35 Claims, 8 Drawing Sheets

COMBINED RATE/WIDTH MODULATION ARRANGEMENT

RELATED APPLICATION

This application is related to a concurrently filed application by the same named inventors and entitled "Indirect D/A Converter."

FIELD OF THE INVENTION

This invention relates to a method of and circuitry for generating a combined rate/width modulated pulse signal in response to the reception of a digital input signal.

BACKGROUND OF THE INVENTION

Signal conversion arrangements are known which respond to the reception of a digital input signal and generate an output signal comprising either a rate modulated or a width modulated pulse stream. Signal conversion arrangements of this type are frequently used in connection with indirect d/a converters. If rate modulation is used, the output signal comprises one more pulses of a constant width with the number of pulses being dependent upon the binary value of the input signal. If width modulation is used, the output signal comprises a single pulse whose width is dependent upon the binary value of the input signal. Arrangements of this type are disclosed in section 7.4 on pages 204 et. seq. of Electronic Analog Digital Conversion by H. Schmid published by Van Nostrand Reinhold, New York in 1970.

Although both pulse rate and pulse width modulation are known and are suitable in many instances, both arrangements are less than ideal for certain applications. Pulse rate modulation is disadvantageous for input signals having a large number of data bits because of the high frequencies generated and because of semiconductor circuitry problems caused by signals having an excessively large number of transitions. For example, a sixteen bit wide input signal can have $2 \times 2^{16}$ transitions (131072 transitions) for each word received. This number of transitions generates high frequency signals which can radiate throughout the circuitry of the utilization device for the rate modulated signal and cause problems if expensive precautions are not taken. The accuracy of a D-A converter with such a large number of transitions can be limited by timing accuracy of the transitions. For instance, if the pulses were 50 ns long, for a 16 bit D-A converter, a timing error in the transitions of 0.76 ps could cause a least significant bit error. Such a timing error could easily be caused by temperature changes, power supply variations, noise radiated from nearby circuits, etc. . Also, transitions of this magnitude can cause problems in the semiconductor circuitry used to generate the rate modulated signals. It is a characteristic of semiconductors that their junctions generate heat upon the reception of input signals with the amount of heat generated being dependent upon the number of transitions per second of the input signal. The large number of transitions resulting from input signals of a high binary value can generate sufficient heat so that the operating characteristics of the semiconductor devices are changed. This causes the devices to generate output pulses of differing energy values for different input signals. This is an intolerable situation for indirect digital to analog converters since their output pulses must each be of a uniform and predictable value. The reception of pulses having different energy values by output filters causes the analog output signal of the filters to vary by factors other than the digital value of the input signal. This represent an unacceptable situation for the high quality devices in which the D/A converter may be used.

Indirect d/a converters are known that use pulse width modulation. In these devices, the reception of each input signal generates a single output pulse whose width is determined by the binary value of the input signal. Generally, the larger the binary value of the input signal, the greater the width of the output signal that is generated. Although width modulation avoids the problems associated with rate modulation, width modulation has its own problems. The primary problem is the low frequencies involved for large value input signals. The worse case situation exists when the output signal is high fifty percent (50%) of the time and low fifty percent (50%) of the time. In such instances, the low frequencies involved require output filters that are large, costly, complex and slow in responding to changes in input compared to the relatively inexpensive filters that can be used for higher frequency signals. The use of large filters increases the size and/or the cost of the devices using the indirect d/a converters.

It may therefore be seen from the above that the known pulse rate and width modulation arrangements used in digital conversion circuits are disadvantageous and cause problems in the associated utilization devices.

SUMMARY OF THE INVENTION

The present invention solves the above discussed problems and achieves a technical advance by providing circuitry that responds to the reception of digital input signals and generates an output signal comprising a pulse stream that may be both rate and width modulated. The lower order bits of the input signal generate a rate modulated pulse stream. The higher order bits width modulate the rate modulated pulses. The net result is that the resultant output stream contains one or more pulses of differing widths depending upon the binary value of the input signal. For example, assume circuitry embodying the present invention operates in response to the reception of sixteen bit data words. If only the least significant bit (bit 0) is a 1, the output signal consists of one narrow pulse per word. If the input signal is a 1 in only its next higher bit position (a binary 2), an output signal is generated having two narrow pulses per word. Similarly an input signal having a 1 in only its third order bit (a binary 4), generates an output signal having four narrow pulses. A signal having only its bit 8 high (binary 256), generates an output signal having 256 narrow pulses. In other words the receipt of data words having binary values between the range of 0 and 256 generates an output signal having a number of narrow pulses equal to the binary value of the lower order eight bits of the received word. This is "rate modulation".

Input signals whose data bits have a binary value greater than 256 generate output signals having pulses that are both rate and width modulated. Each different pattern of bits in an input word generates an output signal having a plurality of pulses that are unique with respect to the number of pulses generated and/or the width of the pulses.

As mentioned, with only bit 8 high for a binary value of 256, the circuit generates 256 narrow output pulses. As the binary value of the input signal increases and with only its data bits d8 and d0 high, the circuit generates 255 narrow 100 nanosecond pulses and one wider 200 nanosecond pulse per input word. As the input data increases in binary value, an additional one of the 256 output pulses becomes 100 nanoseconds wider for each input data lsb (least significant bit) increase. When only bit 15 is high, the circuit outputs 256 pulses each of which is 12,800 nanoseconds wide. This is a fifty percent (50%) duty cycle pulse output. When all input data bits are high, the circuit generates one output pulse per period which is 6.5535 ms long.

The circuit of the present invention combines the best aspects of both rate and width modulation and avoids the disadvantages of both. The output signals generated are within the frequency range the type that may be conveniently handled by an inexpensive two pole filter to generate precision analog output signals. This avoids the need for the use of the larger, slower and more costly filter that would be required if lower frequencies were involved. The number of transmissions in the generated output signal are not excessively high so as to cause timing sensitivity and do not generate sufficient heat in the integrated circuits that processes the signals so as to alter the operating characteristics of the circuits and adversely alter the energy level of the generated output pulses.

In summary, the combined rate/width modulated output signal generated by the circuitry of the present invention solves the aforementioned problems of the priorly known arrangements and therefore achieves a technical advance in the art.

BRIEF DESCRIPTION OF THE DRAWING

The above and other advantages of the invention may be better understood from a reading of the following description thereof taken in conjunction with the drawing in which.

DETAILED DESCRIPTION

Figure 1:
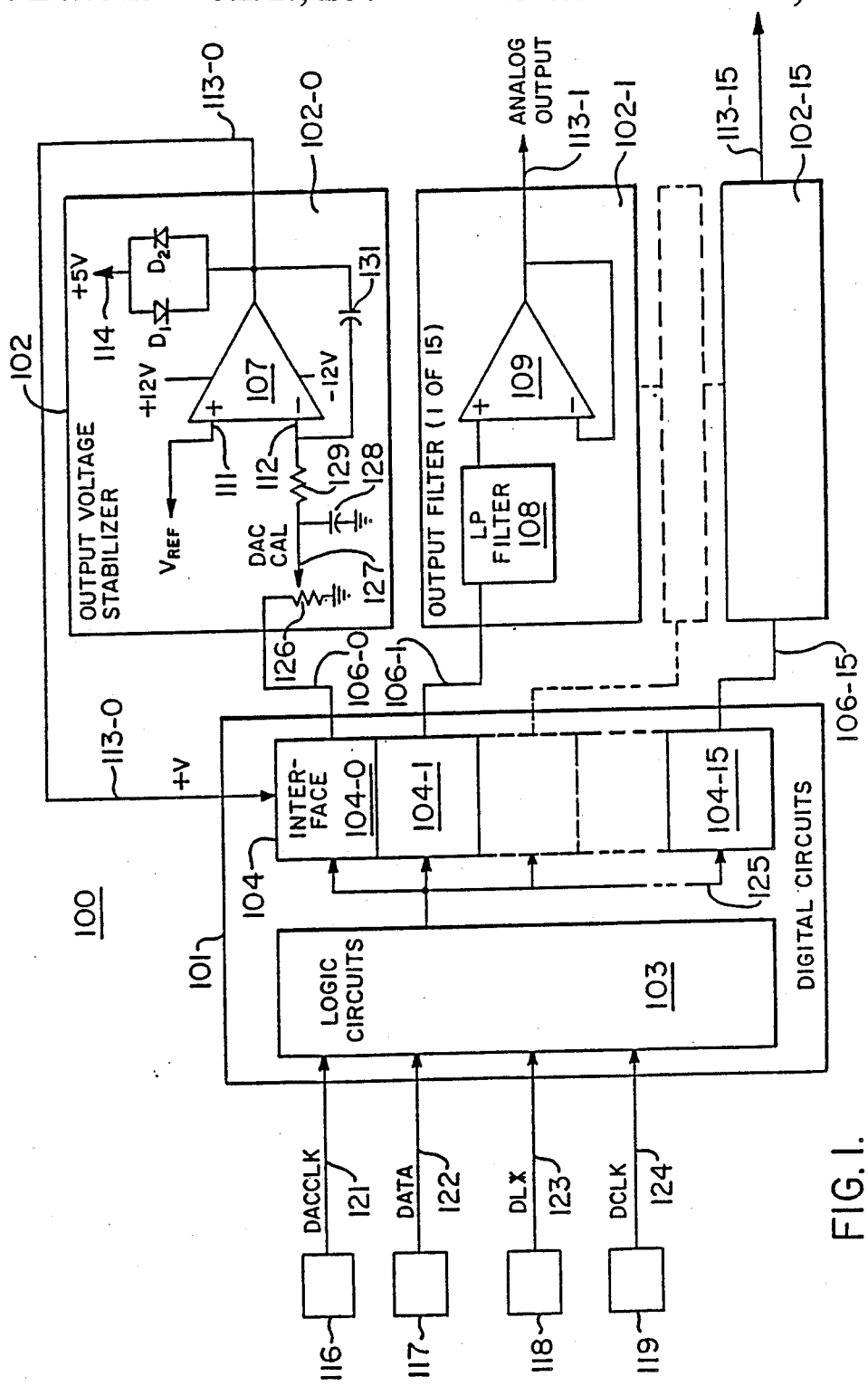
FIG. 1 illustrates apparatus embodying the invention in block diagram form.

Description of FIG. 1

FIG. 1 discloses apparatus embodying the present invention as comprising digital circuits 101, output voltage stabilizer 102-0 and output filters 102-1 through 102-15. The digital circuits 101 comprises logic circuits 103 and interface 104 having 16 sections designated 104-0 through 104-15.

Signal sources 116 through 119, respectively, apply signals over conductors 121 through 124, respectively, to the inputs of logic circuits 103. Element 116 applies a refresh clock signal (DACCLK) to conductor 121. Element 117 applies DATA words containing address and data bits to conductor 122. Element 118 applies data latch signals (DL*) to conductor 123 and element 119 applies data load clock signals (DCLK) to conductor 124.

Figure 2:
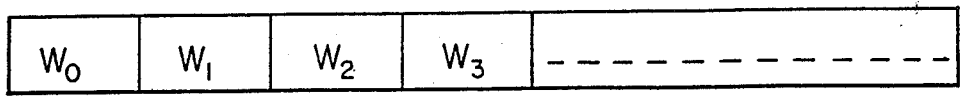
FIGS. 2, 3 and 4 illustrate further details of the input signals applied to the converter of FIG. 1.
Figure 3:
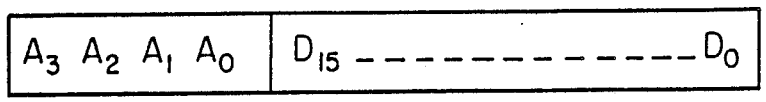
Figure 4:
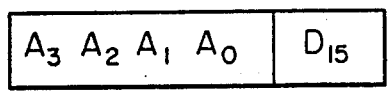
Figure 13:
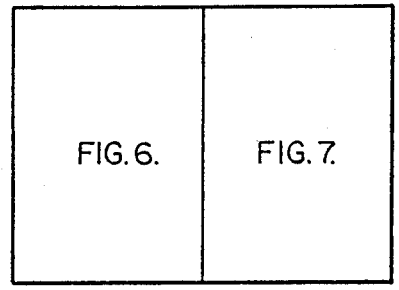
FIG. 13 shows how FIGS. 6 and 7 should be arranged.

FIGS. 2, 3 and 4 disclose data words of the type that element 117 generates and applies sequentially to lead 122. This is shown on FIG. 2 by words W0, W1, W2, W3 etc. The words of FIG. 2 may have bit patterns as shown on FIGS. 3 and 4. FIG. 3 discloses the bit pattern of a word having 16 data bits. FIG. 4 discloses the bit pattern of a word having 1 data bit. The word of FIG. 3 has four address bits A0, A1, A2 and A3 followed by the 16 data bits designated D0 through D15. FIG. 4 discloses a 1 bit data word having four address bits and one data bit designated D15. Other words having differing quantities of data bits may be applied to lead 122 with the possible range of data bits for the data words not shown extending from 2 to 15. The number of bits in a word is dependent upon the system function to be controlled by the word. As priorly mentioned, a relatively simple on/off function may be controlled by the 1 bit data word of FIG. 4 while a complex function may be controlled by the 16 bit data word of FIG. 3.

The words that are sequentially received as shown on FIG. 2 need not have any functional relationship to each other. For example, word W0 may be directed to any one of the 16 channels of the disclosed D/A converter in accordance with the value of the A- address bits in the word. Word W1 may have the same address as does word W0 and would then be directed to the same converter channel. Alternatively, word W1 may be directed to any of the other 15 channels.

Logic circuits 103 have 16 sections, one for each of the possible 16 addresses that can be specified by the four A- bits of a received word. The address and data bits of a word are entered sequentially into a common shift register, bit by bit, in logic circuits 103 under control of data load clock signals (DCLK) applied to conductor 124. After all bits of a word have been entered into the shift register, the data bits are latched from the shift register into the appropriate section of a latch under control of the address bits and by the latch signal (DL*) on conductor 123.

The data bits stored in the latch are converted from binary to a combined rate/width modulated pulse signal that are applied over conductors 125 to interface 104. Interface 104 has 16 sections each of which is associated with one of the sections of logic circuits 103. Thus, interface section 104-0 is associated with the section of circuits 103 that is specified by an address of 0 for the A-bits. Interface section 104-15 is associated with the section of circuits 103 specified by A-address bits having a binary value of 15. The rate/width modulated signal applied to a section of interface 104 is applied out from the interface over the corresponding one of output leads 106-0 through 106-15 which extend to a corresponding one of elements 102-0 through 102-15. Filter elements 102-1 through 102-15 each filter a rate/width modulated signal on an associated path 106- and convert each such signal into a corresponding analog output signal. The output signal generated by filters 102-1 through 102-15 are applied to the associated ones of output conductors 113-1 through 113-15.

Element 102-0 is an output voltage stabilizer which receives a rate/width modulated signal on path 106-0 and uses it to control the value of the +V potential applied by path 113-0 to the upper input of interface 104. The signal on path 106-0 is applied to the upper input of potentiometer 126. Tap 127 on the potentiometer extends the signal through RC circuit 128 and 129 to the lower input 112 of comparator 107. The upper input 111 of comparator 107 receives a precision voltage reference signal (VREF). VREF is a fixed voltage reference that can fall between +1 volt and +4 volts. Comparator 107 holds its output on path 113-0 near +5 volts. The diodes D1 and D2 are clamps that prevent the potential on path 113-0 from differing from 5 volts in either direction by more than the drop of a diode at initial power up of the circuit.

At setup time when the system is initialized, tap 127 of the potentiometer is adjusted so that the output on path 113-1 is precisely 5 volts whenever words having all 1s for the 16 data bits are applied to both channels 0 and 1 of logic circuits 103. This all 1s signal applied to channels 0 and 1 generates a rate/width modulated output signal that is applied over path 125 to segments 104-0 and 104-1 of interface 104. From there, the signals are applied over path 106-0 to the top of the potentiometer 126 whose slider 127 is adjusted so that the output 113-0 is set to approximately 5 volts. It is important that the +V signal on lead 113-0 is precisely regulated at all times in order that the pulsed signal applied to filters 102-1 through 102-15 will have a precisely known value so that, in turn, the maximum value of the analog output signals of 113-1 through 113-15 of the filters may be determined with precision. The all 1's signal applied to channel 1 permits a measurement to be made to verify that the voltage on path 113-1 is 5 volts. This is subsequently described in further detail.

In partial summary of the function of FIG. 1, successive input words are applied to lead 122. The data bits of each word are steered into the appropriate section of logic circuits 103 under control of the A- address bits in each word. The data bits of each word are converted into a rate/width modulated pulse signal by logic circuits 103 and extended through an associated section of interface 104 to the associated one of conductors 106-0 through 106-15. The rate/width modulated pulses are applied to either the output voltage stabilizer 102-0 over path 106-0 or to one of filters 102-1 through 102-15 over paths 106-1 through 106-15. The signals received by the filters are converted to analog signals representing the binary value of the associated word received on path 122. The signals on paths 113-1 through 113-15 to perform the system functions associated with each received data word. The signal applied to path 106-0 stabilizes the +V input voltage to interface 104. This voltage is held near 5 volts so that the input signals to the filters and the output signals generated by the filters are held to precisely controlled values.

Assume that signals on paths 113- at the output of filters 102-1 through 102-15 can vary between 0 and 5 volts. Also assume that a word having 16 data bits of all 1s is received. This word is entered into the appropriate section of logic circuits 103, processed by these circuits, applied to interface 104 and appears as a rate/width modulated signal on a path 106-. This signal is received by the associated filter 102- which integrates the modulated signal and produces an analog output signal having a constant amplitude of 5 volts. This 5 volt signal is the maximum output of the filter for a received word on path 122 having a 1 for each of its 16 data bits. For the reception of a received word having all 0s, the filter 102- would generate an output signal having an amplitude of 0 volts. The reception of other words whose data bits have binary values between 0 and all 1s would generate analog output signals representing the value of the received data bits in these other words.

The left side of FIG. 1 shows signal sources 116 through 119 applying signals to conductors 121 through 124. Although elements 116 through 119 are shown as discrete elements, these elements could, if desired, comprise a microprocessor operating under program control to generate all of the signals required by conductors 121 through 124. FIG. 1 shows elements 116 through 119 as discrete devices to simplify and facilitate an understanding of the invention. It is to be understood that the invention may also be practiced by using a single program control led microprocessor to perform all the functions of elements 116 through 119.

Figure 5:
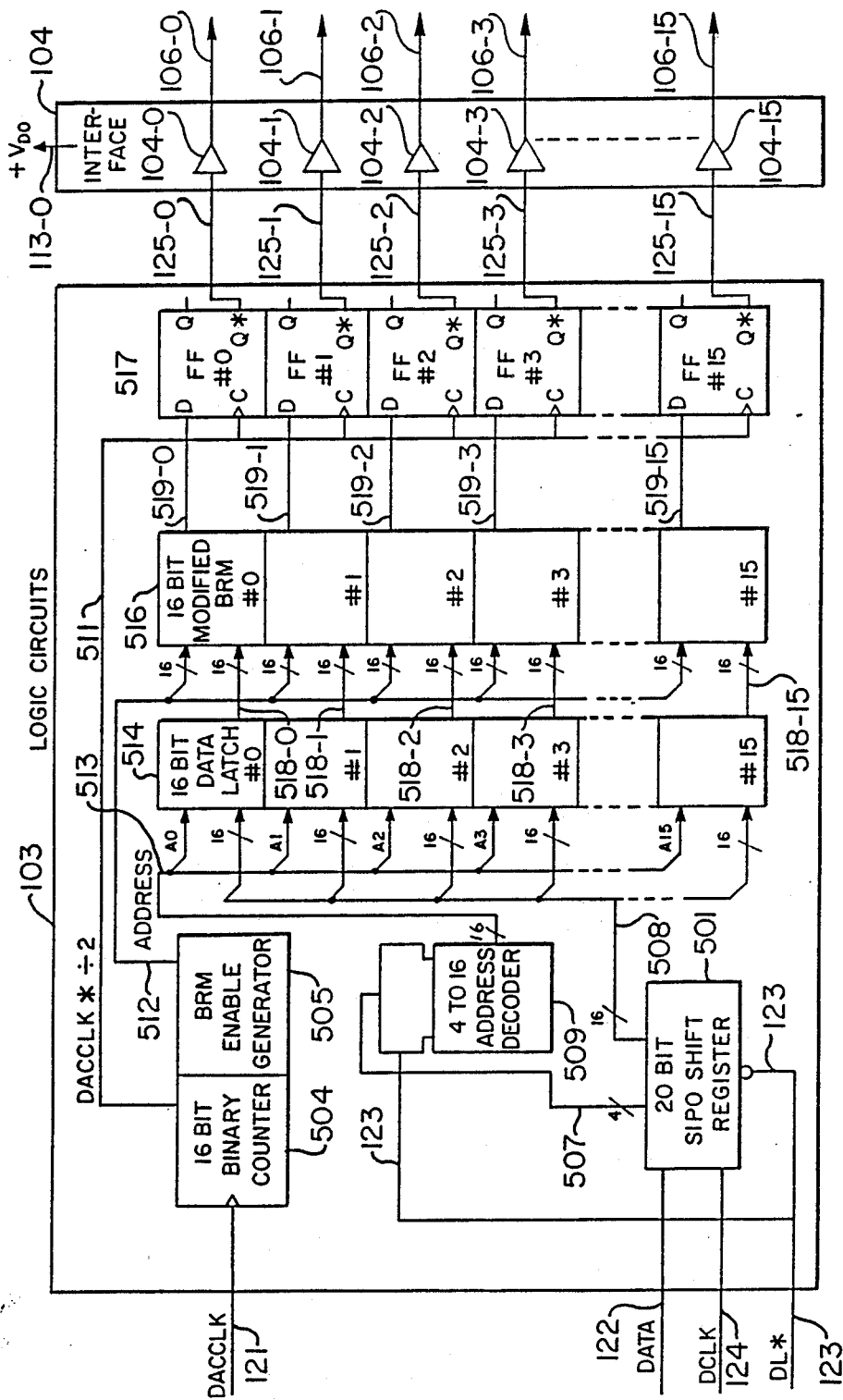
FIG. 5 illustrates further details of the digital circuits of FIG. 1.

Description of FIG. 5

FIG. 5 discloses further details of logic circuits 103 and interface 104 of FIG. 1. Input conductors 121 through 124 are shown on the left side of FIG. 5. These conductors apply the same signals to logic circuits 103 as described in connection with FIG. 1. The data refresh clock signal (DACCLK) is applied over conductor 121 to a 16 bit binary counter 504. DATA words are applied over conductor 122 to the upper input of shift register 501. Data load clock signals (DCLK) are applied over conductor 124 to the lower left input of shift register 501. The data latch signal (DL*) is applied over conductor 123 to the bottom input of shift register 501. The data latch signal is also applied over conductor 123 to the left input of the 4 to 16 address decoder 509.

Logic circuits 103 further comprise a sixteen section 16 bit data latch 514, a sixteen section 16 bit modified binary rate multiplier (BRM) 516, and 16 flip flops 517. The function of these circuits is subsequently described in detail.

Data words, of the type shown on FIGS. 3 and 4 are applied over conductor 122 to the top left input of shift register 501. A data load clock signal (DCLK) is applied to path 124 as each bit of a word is applied over path 122 to the upper left input of shift register 501. Each DCLK signal clocks into shift register 501 the bit that is concurrently received on conductor 122.

Figure 9:
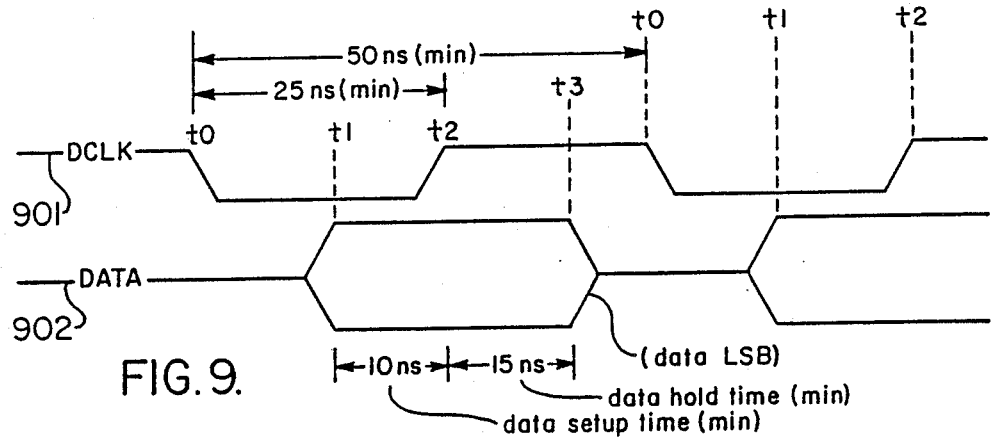
FIGS. 9, 10 and 11 are wave forms illustrating the relationship between and characteristics of the input data signal, the latch signal and the clock signal applied to the converter of FIG. 1.

FIG. 9 shows the relationship between the DATA pulses and the DCLK pulses. A data pulse is shown on line 902 and a DCLK pulse is shown on line 901 of FIG. 9. A data pulse on line 902 may be either positive or negative going depending upon whether the data bit represented by the pulse is a binary 1 or a binary 0. A data pulse is 25 nanoseconds minimum in duration. The DCLK pulse data clock on line 901 precedes the data pulse by at least 10 nanoseconds. Each rising edge of a DCLK pulse shifts the associated data pulse serially into shift register 501.

On line 901, the DCLK pulse has a negative transition at time t0. The data pulse may have either a positive or a negative transition at time t1 depending upon the bit value represented by the pulse. The DCLK pulse has a rising transition at time t2 which clocks the associated data pulse on line 902 into shift register 501. The process then repeats, the next DCLK pulse has a negative transition at the next time t0 on FIG. 9 and a positive transition at the next t2 time which clocks in the next pulse on line 902.

The leftmost data pulse on line 902 may be assumed to be the first bit of a received data word. In this case, it is the least significant bit (LSB) of the word. This is the LSB data bit.

The maximum clock rate of the DCLK pulse is 20 megahertz and the duty cycle is 50 percent. A DCLK pulse is generated only when a bits is applied to path 122. The DCLK signal rests in the high state after all bits of a word are shifted into register 501. This is shown on line 1001 of FIG. 10. The last bit of a word shifted in is the most significant bit (MSB) of the address. Since shift register 501 is cleared after each readout of the shift register, fewer than 16 data bits may be used to represent a received data word. The circuitry of FIG. 5 operates as an N bit digital to analog converter where N equals or is less than 16 if less than 16 data bits for a word are received. The MSB of the data field of a word is always followed by four A- address bits as shown on FIGS. 3 and 4.

Figure 10:
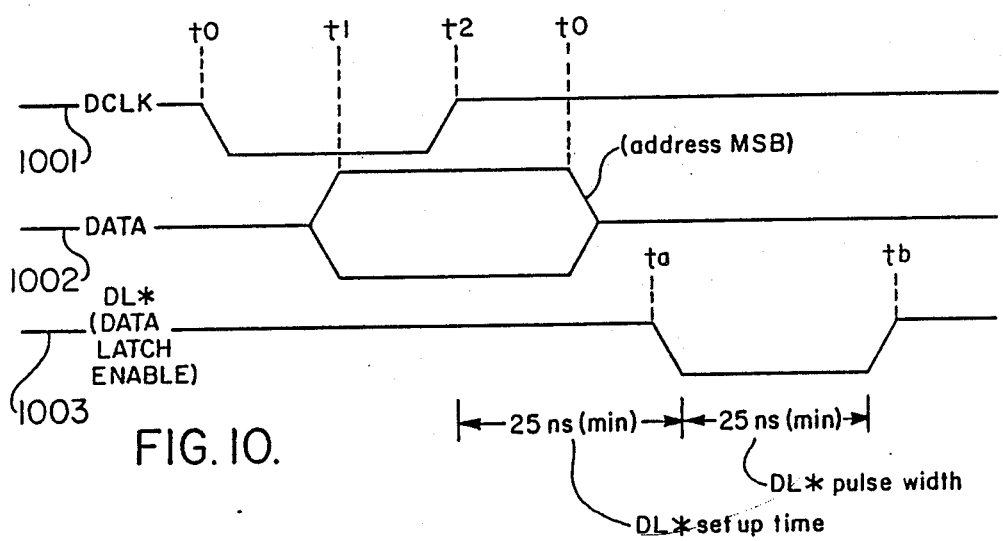

FIG. 10 discloses the relationship between the DCLK pulse on line 1001, the last received bit of a word (the MSB of the address) on line 1002, and the DL* (data latch enable) pulse on line 1003. The DCLK pulse on line 1001 has a negative going transition at time t0. The last received bit (the MSB address bit) on line 1002 has its first transition at time t1. At time t2, the positive going transition of the DCLK pulse clocks the bit on line 1002 into shift register 501. The DL* pulse on line 1003 has a negative going transition at time ta which is approximately 25 nanoseconds after time t2. The positive going transition of the DL* pulse at time tb effects a readout of the shift register and, at this time, the bits that are in the shift register are applied out in parallel over paths 507 and 508. Path 507 receives the four A- address bits. Path 508 receives the D- data bits. For a received word having 16 data bits, path 508 receives 16 parallel data bits.

The four A- address bits are applied over path 507 to decoder 509 which generates a 1 out of 16 output signal to activate the one conductor of the 16 comprising path 513 that is associated with the section of latch 514 into which the data bits from shift register 501 are to be entered. Concurrently with the activation of this one conductor of path 513, the data bits in shift register 501 are applied over path 508 to the inputs of all 16 sections of latch 514. However, the only section of latch 514 that registers the data bits on path 508 is the one section that is specified by the address bits on path 507.

Figure 11:
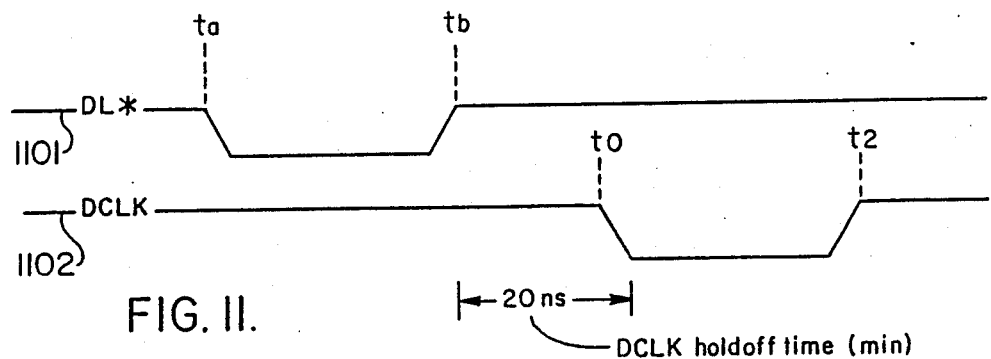

The rising edge of the DL* signal on lines 1003 and 1102 at time tb, prepares shift register 501 to be cleared by the next falling edge of the DCLK pulse. The DL* signal rests in a high state as shown on FIG. 11 after the data bits of a word are read out of shift register 501 at time tb. In normal operation, the DL* signal and the DCLK signal are never low at the same time. The minimum width of the DL* signal on lines 1003 and 1101 is 25 nanoseconds. The resetting of the shift register is subsequently effected by the falling edge of the DCLK signal on line 1102 at time t0. This occurs when the LSB of the next word is received on path 122.

In summary of the operation of the data loading operation of the circuitry of FIG. 5, a data word is received in a serial format on path 122 and entered into shift register 501 under control of DCLK pulses on path 124. The bits of the word are subsequently read out of the shift register 501 in parallel by the DL* signal applied to path 123. This enters the readout data bits into one of the sections of latch 514 under control of decoder 509 and the four A- address bits of the word.

Figure 8:
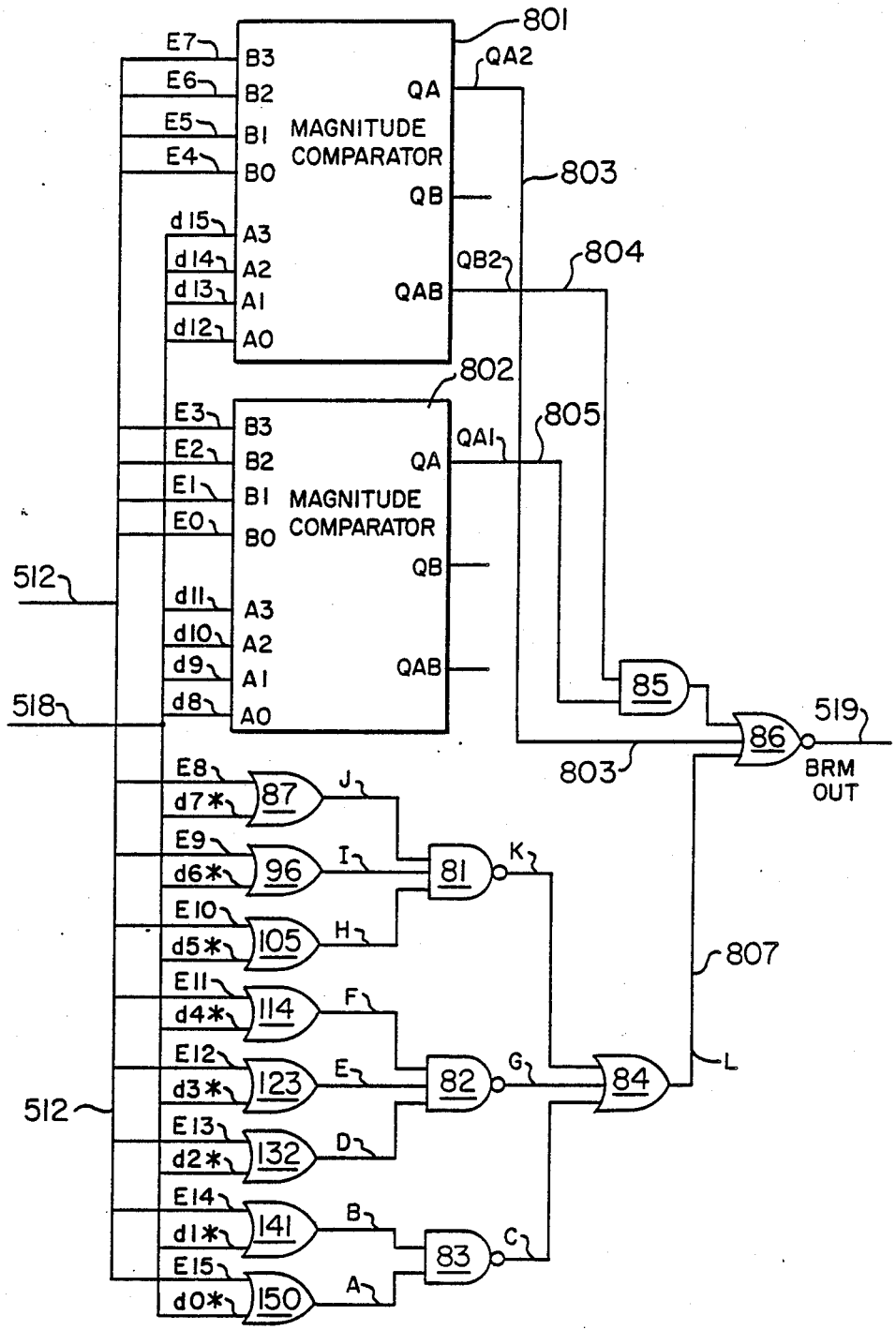
FIG. 8 discloses further details of the modified binary rate multiplier of FIG. 5.

The information stored in a section of data latch 514 is continuously applied by the section over its associated output path 518 to its associated section of the 16 bit modified BRM (binary rate multiplier) 516. BRM 516 has a section individual to each of the 16 sections of latch 514. FIG. 8 discloses further details of a section of BRM 516. Since the BRM 516 has 16 sections, the entire BRM 516 comprises 16 individual circuits of the type shown on FIG. 8.

Description of FIG. 8

The circuitry of FIG. 8 may be divided into upper and lower portions with the lower portion comprising a plurality of OR gates of which gate 87 is the top most and gate 150 is the bottom most. The upper portion comprises two magnitude comparators 801 and 802 which are functionally similar to Texas Instrument SN 5485 and SN 7485 type devices. The upper 8 data bits (D8 through D15) of path 518 from latch 516 are applied to the magnitude comparators. The * or "not" function of the lower most 8 data bits (D0* through D7*) on path 518 is applied to the OR gates on the bottom left part of FIG. 8. These OR gates also receive over path 512 the upper 8 enable pulses (E8 through E15) generated by the BRM enable generator 505. The magnitude comparators 801 and 802 receive the lower 8 enable bits (E0 through E7) on path 512. The outputs of the magnitude comparators are applied to gates 85 and 86. The outputs of the gates in the lower half of FIG. 8 are applied to the lower input of OR gate 86 over conductor 807.

The BRM circuitry of FIG. 8 responds to the coincident reception of data bits from a latch 514 on path 518 and enable bits on path 512 from BRM enable generator 505. In response, it generates a combined rate/width modulated pulse signal that is applied to 519. This signal is modulated in accordance with the binary value of the data bits on path 518 from a latch 514. The details of this signal are subsequently described.

Figure 6:
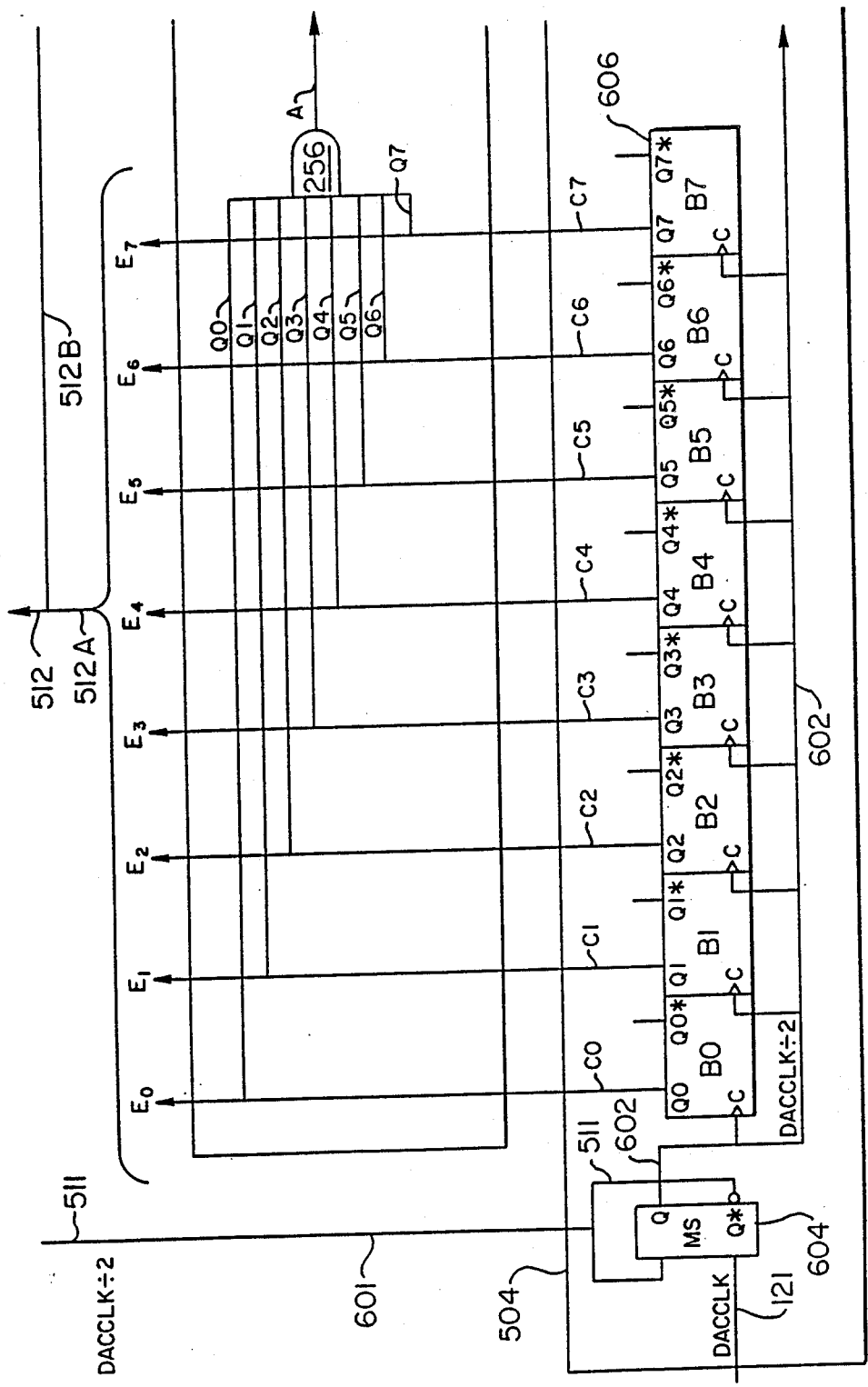
FIGS. 6 and 7, when arranged as shown in FIG. 13, discloses further details of the 16 bit synchronous binary counter and the binary rate multiplier enable generator of FIG. 5.
Figure 7:
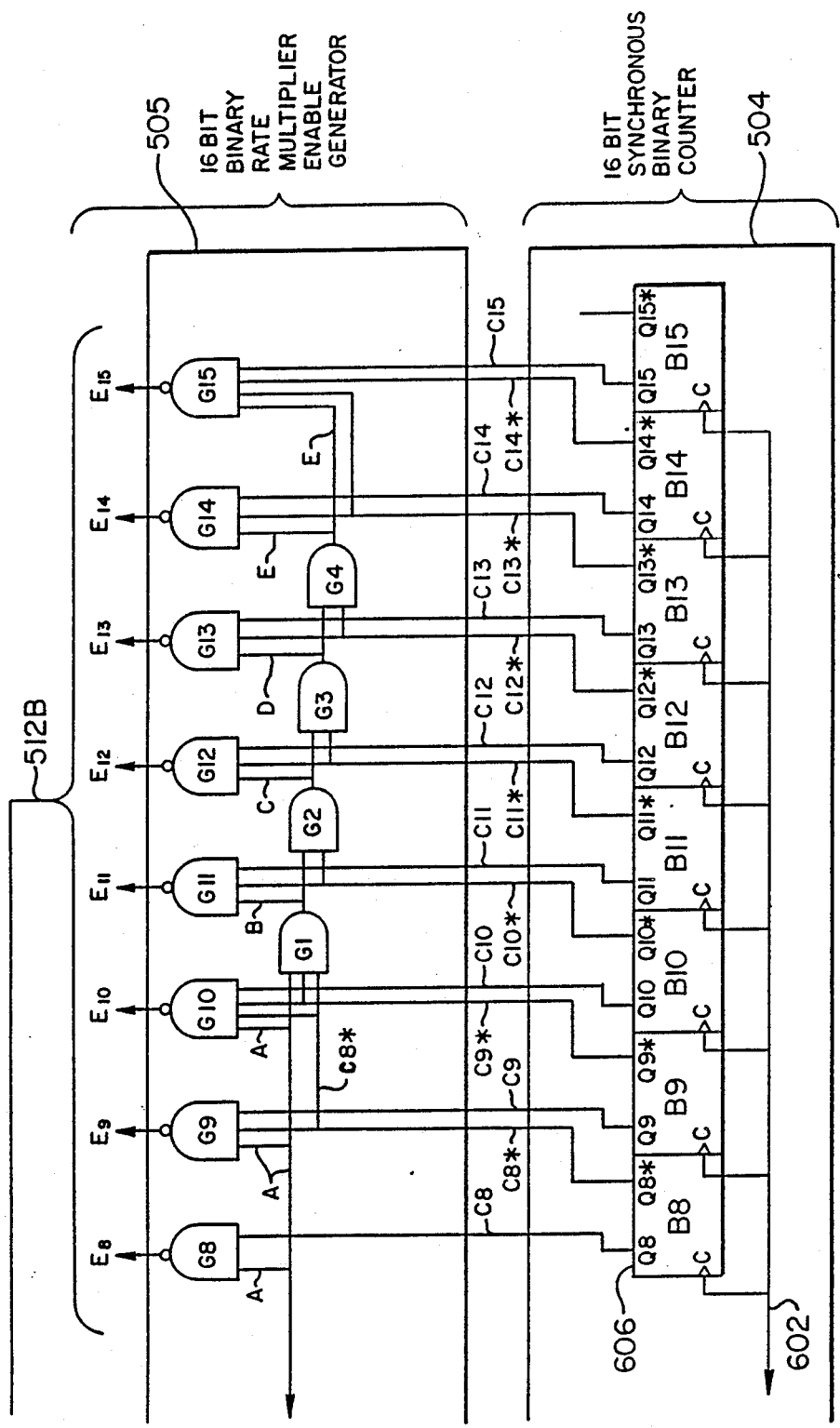

Description of FIGS. 6 and 7

FIGS. 6 and 7 disclose further details of the 16 bit binary counter 504 and the BRM enable generator 505. The refresh clock signal DACCLK is received on path 121 on FIG. 6 and is divided by ½ by element 604 which may be a master slave flip flop. Element 604 generates Q and Q* output signals that have a precise 50% duty cycle. The DACCLK*/2 signal on path 511 is the Q* output of element 604. The DAACK/2 is the Q output and is applied over path 602 as counting pulses to the c(clock) input of each section, (B0–B15) of the synchronous 16 bit binary counter 504. The outputs of these counter sections are connected to associated ones of conductors C0 through C15 and C8* through C15* on FIGS. 6 and 7. The signals on paths C0 through C7 extend directly to paths E0 through E7. The signals on paths C8 through C15 extend through one or more gates on FIG. 7 to paths E8 through E15. Paths E0 through E15 comprise paths 512A and 512 on which extends from BRM enable generator 505 to the inputs of BRM element 516. All 16 of the enable pulses from the circuitry of FIGS. 6 and 7 are applied to each section of the modified BRM 516. The FIG. 8 circuitry responds to the concurrent reception of enable signals on path 512 and data bits on path 518 from latch 514 and generates the rate/width modulated output signal representing the binary value of the data bits of a word received on path 122 and subsequently stored in latch 514.

In generating the enable signals on conductors E0 through E15, the 16 bit synchronous binary counter 504 responds to the DACCLK/2 signal on path 602 and sequences through its operative states. Since this is a 16 bit counter, there are 65536 different operative states. Section B0 on the left on FIG. 6 is the least significant counter bit position. Section B15 is the most significant bit position. The outputs of the counter are applied to conductors C0 through C7 on FIG. 6 and to conductors C8 through C15 on FIG. 7 as well as to conductors C8* through C15* on FIG. 7. Conductors C0 through C7 extend directly to conductors E0 through E7 and over paths 512A and 512 to the E0 through E7 inputs on BRM element 516 on FIG. 8. Conductors C8 through C15 and C8* through C15* extend to the various gates shown on FIG. 7. The outputs of gates G8 through G15 are applied over conductors E8 through E15 and over paths 512B and 512 to the corresponding inputs on the BRM elements 516 on FIG. 8.

The operation of counter 504 generates the enable signals necessary for BRM element 516 on FIG. 8 to generate a combined rate/width modulated signal on path 519. The signal on path 519 is a rate/width modulated representation of the binary value of the data bits of a received word on path 122. This rate/width modulated signal is subsequently applied to a filter which converts it to the analog signal that is used to control a utilization device such as, for example, an instrument.

The operation of counter 504 and BRM enable generator 505 may be best understood with reference to the following table which sets forth the Boolean relationship between the signals on the E-conductors on FIGS. 6 and 7 and the corresponding state of each section of counter 504. The state of certain other specified leads on FIGS. 6 and 7 is also set forth.

TABLE 1

E0 = Q0
E0* = Q0*
E1 = Q1
E1* = Q1*
E2 = Q2
E2* = Q2*
E3 = Q3
E3* = Q3*
E4 = Q4
E4* = Q4*
E5 = Q5
E5* = Q5*
E6 = Q6
E6* = Q6*
E7 = Q7
E7* = Q7*
E8 = (AQ8)* = A* + Q8*
A = Q0Q1Q2Q3Q4Q5Q6Q7
A* = Q0* + Q1* + Q2* + Q3* + Q4* + Q5* + Q6* + Q7*
E8 = Q0* + Q1* + Q2* + Q3* + Q4* + Q5* + Q6* + Q7* + Q8*
E8* = Q0Q1Q2Q3Q4Q5Q6Q7Q8
E9 = (AQ8*Q9)* = A* + Q8 + Q9*
E9 = Q0* + Q1* + Q2* + Q3* + Q4* + Q5* + Q6* + Q7* + Q8 + Q9*
E9* = Q0Q1Q2Q3Q4Q5Q6Q7Q8*Q9
E10 = (AQ8*Q9*Q10)* = A* + Q8 + Q9 + Q10*
E10 = Q0* + Q1* + Q2* + Q3* + Q4* + Q5* + Q6* + Q7* + Q8 + Q9 + Q10*
E10* = Q0Q1Q2Q3Q4Q5Q6Q7Q8*Q9*Q10
E11 = (BQ10*Q11)* = B* + Q10 + Q11*
B = AQ8*Q9* = Q0Q1Q2Q3Q4Q5Q6Q7Q8*Q9*
B* = A* + Q8 + Q9 = Q0* + Q1* + Q2* + Q3* + Q4* + Q5* + Q6* + Q7* + Q8 + Q9
E11 = Q0* + Q1* + Q2* + Q3* + Q4* + Q5* + Q6* +

TABLE 1-continued

Q7* + Q8 + Q9 + Q10 + Q11*
E11* = Q0Q1Q2Q3Q4Q5Q6Q7Q8*Q9*Q10*Q11
E12 = (CQ11*Q12)* = C* + Q11 + Q12*
C = Bq10*
C = Q0Q1Q2Q3Q4Q5Q6Q7Q8*Q9*Q10*
C* = Q0* + Q1* + Q2* + Q3* + Q4* + Q5* + Q6* + Q7* + Q8 + Q9 + Q10
E12 = Q0* + Q1* + Q2* + Q3* + Q4* + Q5* + Q6* + Q7* + Q8 + Q9 + Q10 + Q11 + Q12*
E12* = Q0Q1Q2Q3Q4Q5Q6Q7Q8*Q9*Q10*Q11*Q12
E13 = (DQ12*Q13)* = D* + Q12 + Q13*
D = CQ11*
D = Q0Q1Q2Q3Q4Q5Q6Q7Q8*Q9*Q10*Q11*
D* = Q0* + Q1* + Q2* + Q3* + Q4* + Q5* + Q6* + Q7* + Q8 + Q9 + Q10 + Q11
E13 = Q0* + Q1* + Q2* + Q3* + Q4* + Q5* + Q6* + Q7* + Q8 + Q9 + Q10 + Q11 + Q12 + Q13*
E14 = (EQ13*Q14)* = E* + Q13 + Q14*
E = DQ12*
E = Q0Q1Q2Q3Q4Q5Q6Q7Q8*Q9*Q10*Q11*Q12*
E* = Q0* + Q1* + Q2* + Q3* + Q4* + Q5* + Q6* + Q7* + Q8 + Q9 + Q10 + Q11 + Q12
E14 = Q0* + Q1* + Q2* + Q3* + Q4* + Q5* + Q6* + Q7* + Q8 + Q9 + Q10 + Q11 + Q12 + Q13 + Q14*
E14* = Q0Q1Q2Q3Q4Q5Q6Q7Q8*Q9*Q10*Q11*Q12*Q13*Q14
E15 = (EQ13*Q14*Q15)* = E* + Q13 + Q14 + Q15*
E15 = Q0* + Q1* + Q2* + Q3* + Q4* + Q5* + Q6* + Q7* + Q8 + Q9 + Q10 + Q11 + Q12 + Q13 + Q14 + Q15*
E15* = Q0Q1Q2Q3Q4Q5Q6Q7Q8*Q9*Q10*Q11*Q12*Q13*Q14*Q15

The BRM 516 of FIG. 8 receives the E- enable signals characterized in Table 1 and generates a rate/width modulated signal on its output lead 519 under control of the data bits received on the d-input on FIG. 8. The signals on path 125 are not dependent upon precise delays through elements 516, 505 and 504 as elsewhere described.

The output conductors on FIG. 8 are designated A, B, D, E, F, H, I and J for the column of OR gates of which gate 87 is the top most gate. These conductors extend into NAND gates 81, 82 and 83 with the outputs of these gates being designated K, G and C which extend to the inputs of OR gate 84 whose output is designated as L. The operation of these gates on the lower portion of FIG. 8 may be best characterized by the Boolean expressions set forth in the following Table 2. These gates generate the rate modulated portion of the signal on path 519.

TABLE 2

Boolean equations describing logic in FIG. 8
Modified Binary Rate Multiplier
A = E15 + d0*
A* = (E15 + d0*)* = E15*d0
B = E14 + d1*
B* = (E14 + d1*)* = E14*d1
C = (AB)* = A* + B* = E15*d0 + E14*d1
D = E13 + d2*
D* = (E13 + d2*)* = E13*d2
E = E12 + d3*
E* = (E12 + d3*)* = E12*d3
F = E11 + d4*
F* = (E11 + d4*)* = E11*d4
G = (DEF)* = D* + E* + F*
G = E13*d2 + E12*d3 + E11*d4
H = E10 + d5*
H* = (E10 + d5*)* = E10*d5
I = E9 + d6*
I* = (E9 + d6*)* = E9*d6
J = E8 + d7*
J* = (E8 + d7*)* = E8*d7
K = (HIJ)* = H* + I* + J*
K = E10*d5 + E9*d6 + E8*d7
L = C + G + K
L = E15*d0 + E14*d1 + E13*d2 + E12*d3 + E11*d4 +

TABLE 2-continued

E10*d5 + E9*d6 + E8*d7

Comparators 801 and 802 contribute the width modulated portion of the signal on path 519 when they receive the enable signals and data bits. Each comparator functions by determining whether the signals on its A- inputs is equal to, higher than, or lower than the signals on its B- inputs. The function of the comparators may be best expressed by the following Table 3. The top part of Table 3 indicates that A equals a 4 bit digital word on inputs A0 through A3. Also on Table 3, B equals a 4 bit digital word on inputs B0 through B3. Bit A3 is the most significant of the A bits while B3 is the most significant of the B bits.

When A is greater than B, the QA output comparator is 1, the QB output is 0 and the QAB output is 0. When the function A is less then B, the QA output is 0, the QB output is 1 and the QAB output is 0. When function A equals function B, the QA output is 0, the QB output is 0 and the QAB output is 1. The relationships indicated in Table 3 apply to comparator 802.

Table 4 indicates the relationship between the d- and E- signals applied to comparator 801 as well as the output signals generated by the comparator.

TABLE 3

For Comparators 801 and 802
Function
A = A3A2A1A0 , A3 = MSB
B = B3B2B1B0 , B3 = MSB

| Input Condition | QA | QB | QAB |
|---|---|---|---|
| A > B | 1 | 0 | 0 |
| A < B | 0 | 1 | 0 |
| A = B | 0 | 0 | 1 |

TABLE 4

For Comparator 802:
A0 = d8     B0 = E0
A1 = d9     B1 = E1
A2 = d10    B2 = E2
A3 = d11    B3 = E3
And
QA1 = 1 for d11d10d9d8 > E3E2E1E0
And
QA1 = 0 for d11d10d9d8 < E3E2E1E0
And
QA1 = 0 for d11d10d9d8 = E3E2E1E0
where
d11 = MSB, d8 = LSB & E3 = MSB, E0 = LSB Table 5 expresses the indicated relationships for comparator 801.

TABLE 5

For Comparator 801:
A0 = d12    B0 = E4
A1 = d13    B1 = E5
A2 = d14    B2 = E6
A3 = d15    B3 = E7
When d15d14d13d12 > E7E6E5E4
then QA2 = 1 and QAB2 = 0
When d15d14d13d12 < E7E6E5E4
then QA2 = 0 and QAB2 = 0
When d15d14d13d12 = E7E6E5E4
then QA2 = 0 and QAB2 = 1
where d15 = MSB, where d12 = LSB & E7 = MSB, E4 = LSB
Finally
BRM OUT = (QA1QAB2 + QA2 + L)*
BRM OUT = (QA1QAB2+QA2+E15*D0+E14*D1+E13*D2+

TABLE 5-continued

E12*D3+E11*D4+E10*D5+E9*D6+E8*D7)*
and
BRM OUT* = [(QA1QAB2 + QA2 + L)*]*
BRM OUT* = QA1QAB2+QA2+L
BRM OUT* = QA1QAB2+QA2+(E15*D0+E14*D1+E13*D2+E12*
D3+E11*D4+E10*D5+E9*D6+E8*D7)

The expression for BRM output signal on path 519 is shown on the bottom of Table 5. This signal is a function of the output of the two comparators together with the value of the signal L on path 807. From this expression may be derived the value of the output signal for any combination of input signals.

The maximum number of output pulses on a path 519 is 256 per word received on path 122. The period of the word, T(word) is the time required for counter 504 to count $2^{16}$ DAACLK/2 pulses. Since the DACCLK clock on path 121 is divided by two by element 604, $$t(\text{word}) = [2^{(16)}] \times \left(\frac{2}{\text{DACCLK frequency}}\right)$$

The period of a 16 bit D/A converted word with a 20 MHz DACCLK on path 121 is:

$$t(16) = 2^{16} \times \left(\frac{2}{20 \text{ MHz}}\right) = 6.553600 \text{ milliseconds}$$

The expression for the BRM output signal in Table 5 permits the waveform on path 519 to be derived by inserting the proper values for the D-data bits and E-enable bits. The pulse modulated signal on path 519 that represents the D-data bits of a binary word in latch 514 cannot be derived on a "one shot" instantaneous basis. Rather it must be derived by determining the 0 or 1 value of the pulse modulated signal for the entire word period of the binary rate multiplier 516. This word period is defined by the period of time it takes the 16 stage counter 504 to sequence through all of its 65,536 positions. Thus, to identify the pulse pattern on path 519 resulting from a binary word in latch 514, one must insert the values of the D-data bits of the binary word into the expression for BRM out in Table 5 and then must insert the appropriate value for the E-enable bits for each one of the 65,536 positions of counter 504. By determining the 0 or 1 value of BRM out for each of the 65,536 different patterns of the E-bits, one can determine the pulse pattern generated by the binary rate multiplier in response to the presence of the specified binary word in latch 514.

Figure 12:
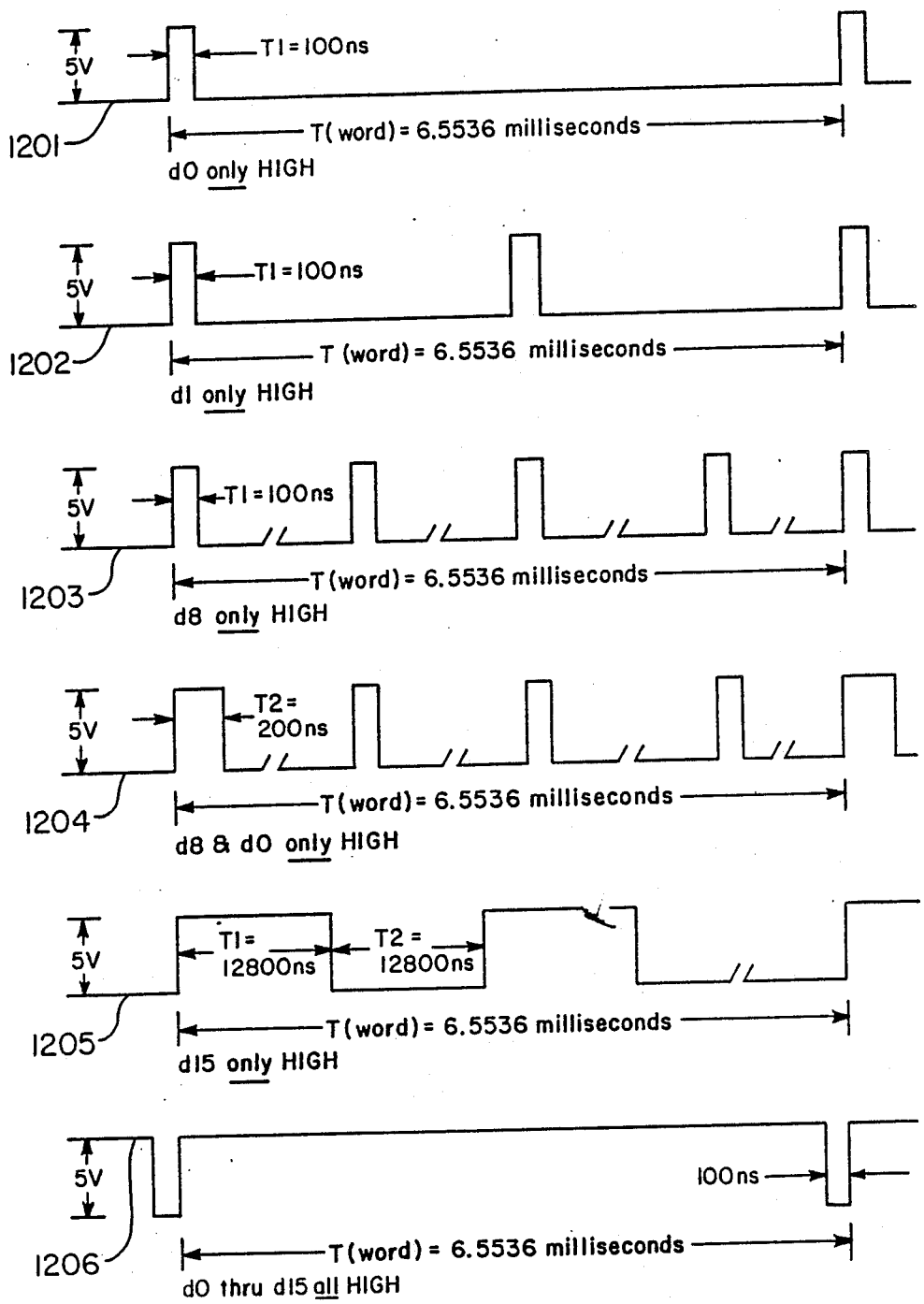
FIG. 12 illustrates with rate/width modulated signal generated by each converter in the digital portion of the circuitry of FIG. 1.

FIG. 12 shows some of the pulse outputs on path 519 with different data inputs on path 122, a 20 MHz DACCLK signal, and using a full 16 bits of data. With all 16 d-data bits of a word LOW, BRM 516 does not output any pulses on path 519 (not shown in FIG. 12). When only the LSB data bit (d0) is HIGH (line 1201) of FIG. 12, BRM 516 outputs one 5 V, 100 nanosecond pulse per T(word) period on path 519. When only data bit d1 is high (line 1202), BRM 516 outputs two 5 V, 100 nanosecond pulses per T(word) period.

For each data LSB increase, BRM 516 outputs one additional 100 nanosecond pulse per T(word) period until only data bit d8 is HIGH. With only data bit d8

HIGH (line 1203), BRM 516 outputs 265 100 nanosecond pulses (the maximum number of pulses) per T(word) period. When only data bits d8 and d0 are both HIGH (line 1204), BRM 516 outputs 255 100 nanosecond pulses and one 200 nanosecond pulse per T(word) period.

As the input data increases in binary value, one of the 256 BRM output pulses becomes 100 nanoseconds wider for each input data LSB increase. When only bit D15 is HIGH (line 1205), BRM 516 outputs 256 5 V, 12800 nanosecond pulses per T(word) period. This is a the 50 percent duty cycle pulse output. When all input data bits d0 through d15 are HIGH (line 1206), BRM 516 outputs one 6.5535 millisecond pulse per T(word) period.

The following Table 6 further illustrates the output signals on conductors 519 for some combinations of low and high data bits received on path 122.

TABLE 6

| HIGH Input Data Bits | LOW Input Data Bits | BRM Output Pulse String Per D/C Word on Path 519 |
|---|---|---|
| none | all(d0→d15) | no pulses out |
| d0 | d1→d15 | one, 5 v, 100 ns wide pulse |
| d1 | d0 & d2→d15 | two, 5 v, 100 ns wide pulses |
| d2 | d0→d1 & d3→d15 | four, 5 v 100 ns wide pulses |
| d3 | d0→d2 & d4→d15 | eight, 5 v 100 ns wide pulses |
| d4 | d0→d3 & d5→d15 | 16, 5 v 100 ns wide pulses |
| d5 | d0→d4 & d6→d15 | 32, 5 v 100 ns wide pulses |
| d6 | d0→d5 & d7→d15 | 64, 5 v 100 ns wide pulses |
| d7 | d0→d6 & d8→d15 | 128, 5 v 100 ns wide pulses |
| d0→d7 | d8→d15 | 255, 5 v 100 ns wide pulses |
| d8 | d0→d7 & d9→d15 | 256, 5 v 100 ns wide pulses |
| d0 & d8 | d1→d7 & d9→d15 | 255, 5 v 100 ns wide pulses and one 5 v 200 ns wide pulse |
| d0→d8 | d9→d15 | one, 5 v, 100 ns wide pulse and 255, 5 v, 200 ns wide pulses |
| d9 | d0→d8 & d10→d15 | 256, 5 v 200 ns wide pulses |
| d0 & d9 | d1→d8 & d10→d15 | 256, 5 v 200 ns wide pulses and one 5 v, 300 ns wide pulse |
| d0→d7 & d9 | d8 & d10→d15 | one, 5 v, 200 ns wide pulse and 255, 5 v, 300 ns wide pulses |
| d8 & d9 | d0→d7 & d10→d15 | 256, 5 v, 300 ns wide pulses |
| d0 & d8 & d9 | d1→d7 & d10→d15 | one, 5 v, 400 ns wide pulse and 255, 5 v, 300 ns wide pulses |
| d0→d9 | d10→d15 | one, 5 v, 300 ns wide pulse and 255, 5 v, 400 ns wide pulses |
| d10 | d0→d9 & d11→d15 | 256, 5 v 400 ns wide pulses |
| d0 & d10 | d1→d9 & d11→d15 | 255, 5 v 400 ns wide pulses and one, 5 v, 500 ns wide pulse |
| d0→d7 & d10 | d8→d9 & d11→d15 | one, 5 v, 400 ns wide pulse and 255, 5 v, 500 ns wide pulses |
| d8 & d10 | d0→d7, d9 & d11→d15 | 256, 5 v, 500 ns wide pulses |
| d0 & d8 & d10 | d1→d7, d9 & d11→d15 | one, 5 v, 600 ns wide pulse and 255, 5 v, 500 ns wide pulses |
| d0→d8 & d10 | d9 & d11→d15 | one, 5 v, 500 ns wide pulse and 255, 5 v, 600 ns wide pulses |
| d9 & d10 | d0→d8 & d11→d15 | 256, 5 v, 600 ns wide pulses |
| d0 & d9 & d10 | d1→d8 & d11→d15 | one, 5 v, 700 ns wide pulse and 255, 5 v, 600 ns wide pulses |
| d0→d7 & d9→d10 | d8 & d11→d15 | one, 5 v, 600 ns wide pulse and 255, 5 v, 700 ns wide pulses |
| d8→d10 | d0→d7 & d11→d15 | 256, 5 v, 700 ns wide pulses |
| d0 & d8→d10 | d1→d7 & d11→d15 | one, 5 v, 800 ns wide pulse and 255, 5 v, 700 ns wide pulses |
| d0→d10 | d11→d15 | one, 5 v, 700 ns wide pulse and 255, 5 v, 800 ns wide pulses |
| d11 | d0→d10 & d12→d15 | 256, 5 v 800 ns wide pulses |
| d0 & d11 | d1→d10 & d12→d15 | 255, 5 v 800 ns wide pulses and one, 5 v, 900 ns wide pulse |
| d0→d7 & d11 | d8→d10 & d12→d15 | one, 5 v, 800 ns wide pulse and 255, 5 v, 900 ns wide pulses |
| d8 & d11 | d0→d7, d9→d10 & d12→d15 | 256, 5 v, 900 ns wide pulses |
| d0 & d8 & d11 | d1→d7, d9→d10 & d12→d15 | one, 5 v, 1000 ns wide pulse and 255, 5 v, 900 ns wide pulses |
| d0→d8 & d11 | d9→d10 & d12→d15 | one, 5 v, 900 ns wide pulse and 255, 5 v, 1000 ns wide pulses |
| d9 & d11 | d0→d8, d10, & d12→15 | 256, 5 v, 1000 ns wide pulses |
| d0, d9, d11 | d1→d8, d10, d12→d15 | one, 5 v, 1100 ns wide pulse and 255, 5 v, 1000 ns wide pulses |
| d0→d7, d9, d11 | d8, d10, d12→d15 | one, 5 v, 1000 ns wide pulse and 255, 5 v, 1100 ns wide pulses |
| d8, d9, d11 | d0→d7, d10 d12→d15 | 256, 5 v, 1100 ns wide pulses |
| d0, d8, d9, d11 | d1→d7, d10, d12→d15 | one, 5 v, 1200 ns wide pulse and 255, 5 v, 1100 ns wide pulses |
| d0→d9, d11 | d10, d12→d15 | one, 5 v, 1100 ns wide pulse and 255, 5 v, 1200 ns wide pulses |
| d10, d11 | d0→d9, d12→d15 | 256, 5 v, 1200 ns wide pulses |
| d0, d10, d11 | d1→d9, d12→d15 | one, 5 v, 1300 ns wide pulse and 255, 5 v, 1200 ns wide pulses |
| d0→d7, d10→d11 | d8→d9, d12→d15 | one, 5 v, 1200 ns wide pulse and 255, 5 v, 1300 ns wide pulses |
| d8, d10→d11 | d0→d7, d9, d12→d15 | 256, 5 v, 1300 ns wide pulses |
| d0, d8, d10→d11 | d1→d7, d9, d12→d15 | one, 5 v, 1400 ns wide pulses and 255, 5 v, 1300 ns wide pulses |
| d0→d8, d10→d11 | d9, d12→d15 | one, 5 v, 1300 ns wide pulse and 255, 5 v, 1400 ns wide pulses |
| d9→d11 | d0→d7, d12→d15 | 256, 5 v, 1400 ns wide pulses |
| d0, d9, d10→d11 | d1→d8, d12→15 | one, 5 v, 1500 ns wide pulse and 255, 5 v, 1400 ns wide pulses |
| d0→d7, d9→d11 | d8, d12→d15 | one, 5 v, 1400 ns wide pulses and 255, 5 v, 1500 ns wide pulses |
| d8→d11 | d0→d7, d12→d15 | 256, 5 v, 1500 ns wide pulses |
| d0, d8→d11 | d1→d7, d12→d15 | one, 5 v, 1600 ns wide pulse and 255, 5 v, |

TABLE 6-continued

| HIGH Input Data Bits | LOW Input Data Bits | BRM Output Pulse String Per D/C Word on Path 519 |
|---|---|---|
| d0→d11 | d12→d15 | one, 5 v, 1500 ns wide pulse and 255, 5 v, 1600 ns wide pulses |
| d12 | d0→d11 & d13→d15 | 256, 5 v 1600 ns wide pulses |
| d0 & d12 | d1→d11 & d13→d15 | 255, 5 v 1600 ns wide pulses and one 5 v 1700 ns wide pulses |
| d0→d7,d12 | d8→d11, d13→d15 | one, 5 v, 1600 ns wide pulse and 255, 5 v, 1700 ns wide pulses |
| d8, d12 | d0→d7, d9→d11 d13→d15 | 256, 5 v, 1700 ns wide pulses |
| d0, d8, d12 | d1→d7, d9→11, d13→d15 | one, 5 v, 1800 ns wide pulse and 255, 5 v, 1700 ns wide pulses |
| d0→d8, d12 | d9→d11, d13→d15 | one, 5 v, 1700 ns wide pulse and 255, 5 v, 1800 ns wide pulses |
| d9, d12 | d0→d8, d10→d11, d13→l5 | 256, 5 v, 1800 ns wide pulses |
| d0, d9, d12 | d1→d8, d10→d11, d13→d15 | one, 5 v, 1900 ns wide pulse and 255, 5 v, 1800 ns wide pulses |
| d0→d7, d12 | d8→d11, d13→d15 | one, 5 v, 1800 ns wide pulse and 255, 5 v, 1900 ns wide pulses |
| d8→d9, d12 | d0→d7, d10→d11, d13→d15 | 256, 5 v, 1900 ns wide pulses |
| d0, d8→d9, d12 | d1→d7, d10→d11, d13→d15 | one, 5 v, 2000 ns wide pulse and 255, 5 v, 1900 ns wide pulses |
| d0→d9, d12 | d10→d11, d13→d15 | one, 5 v, 1900 ns wide pulse and 255, 5 v, 2000 ns wide pulses |
| d10, d12 | d0→d9,d11 d13→d15 | 256, 5 v, 2000 ns wide pulses |
| d0, d10, d12 | d1→d9, d11, d13→d15 | one, 5 v, 2100 ns wide pulse and 255, 5 v, 2000 ns wide pulses |
| d0→d7, d10, d12 | d8→d9, d11, d13→d15 | one, 5 v, 2000 ns wide pulse and 255, 5 v, 2100 ns wide pulses |
| d8, d10, d12 | d0→d7, d9, d11, d13→d15 | 256, 5 v, 2100 ns wide pulses |
| d0, d8, d10, d12 | d1→d7, d9, d11,d13→d15 | one, 5 v, 2200 ns wide pulse and 255, 5 v, 2100 ns wide pulses |
| d0→d8, d10, d12 | d9, d11, d13–d15 | one, 5 v, 2100 ns wide pulse and 255, 5 v, 2200 ns wide pulses |
| d9→d10, d12 | d0→d8, d11, d13→d15 | 256, 5 v, 2200 ns wide pulses |
| d0, d9→d10, d12 | one, 5 v, 2300 ns wide d1→d8, d11, d13→d15 | pulse and 255, 5 v, 2200 ns wide pulses |
| d0→d7, d9→d10, d12 | d8, d11, d13→d15 | one, 5 v, 2200 ns wide pulse and 255, 5 v, 2300 ns wide pulses |
| d8→d10, d12 | d0→d7, d11, d13→d15 | 256, 5 v, 2300 ns wide pulses |
| d0, d8→d10, d1→d7, d11, d12 | one, 5 v, 2400 ns wide d13→d15 | pulse and 255, 5 v, 2300 ns wide pulses |
| d0→d10, d12 | d11, d13→d15 | one, 5 v, 2300 ns wide pulse and 255, 5 v, 2400 ns wide pulses |
| d11→d12 | d0→d10, d13→d15 | 256, 5 v, 2400 ns wide pulses |
| d0, d11→d12 | d1→d10, d13→d15 | one, 5 v, 2500 ns wide pulse and 255, 5 v, 2400 ns wide pulses |
| d0→d7, d11→d12 | d8→d10, d13→d15 | one, 5 v, 2400 ns wide pulse and 255, 5 v, 2500 ns wide pulses |
| d8, d11→d12 | d0→d7, d9→d10, d13→d15 | 256, 5 v, 2500 ns wide pulses |
| d0, d8, d11→d12 | d1→d7, d9→d10, d13→d15 | one, 5 v, 2600 ns wide pulse and 255, 5 v, 2500 ns wide pulses |
| d0→d8, d11→d12 | d9→d10, d13→d15 | one, 5 v, 2500 ns wide pulse and 255, 5 v, 2600 ns wide pulses |
| d9, d11→d12 | d0→d8, d10, d13→d15 | 256, 5 v, 2600 ns wide pulses |
| d0, d9, d11→d12 | d1→d8, d10, d13→d15 | one, 5 v, 2700 ns wide pulse and 255, 5 v, 2600 ns wide pulses |
| d0→d7, d9, d11→d12 | d8, d10, d13→d15 | one, 5 v, 2600 ns wide pulse and 255, 5 v, 2700 ns wide pulses |
| d8→d9, d11→d12 | d0→d7, d10, d13→d15 | 256, 5 v, 2700 ns wide pulses |
| d0, d8→d9, d11→d12 | d1→d7, d10, d13→d15 | one, 5 v, 2800 ns wide pulse and 255, 5 v, 2700 ns wide pulses |
| d0→d9, d11→d12 | d10, d13→d15 | one, 5 v, 2700 ns wide pulse and 255, 5 v, 2800 ns wide pulses |
| d10→d12 | d0→d9, d13→d15 | 256, 5 v, 2800 ns wide pulses |
| d0,d10→d12 | d1→d9, d13→d15 | one, 5 v, 2900 ns wide pulse and 255, 5 v, 2800 ns wide pulses |
| d0→d7, d10→d12 | d8→d9, d13→d15 | one, 5 v, 2800 ns wide pulse and 255, 5 v, 2900 ns wide pulses |
| d8, d10→d12 | d0→d7, d9, d13→d15 | 256, 5 v, 2900 ns wide pulses |
| d0, d8, d10→d12 | d1→d7, d9, d13→d15 | one, 5 v, 3000 ns wide pulse and 255, 5 v, 2900 ns wide pulses |
| d0→d8, d10→d12 | d9, d13→d15 | one, 5 v, 2900 ns wide pulse and 255, 5 v, 3000 ns wide pulses |
| d9→d12 | d0→d8, d13→d15 | 256, 5 v, 3000 ns wide pulses |
| d0, d9→d12 | d1→d8, d13→d15 | one, 5 v, 3100 ns wide pulse and 255, 5 v, 3000 ns wide pulses |
| d0→d7, d9→d12 | d8, d13→d15 | one, 5 v, 3000 ns wide pulse and 255, 5 v, 3100 ns wide pulses |
| d8→d12 | d0→d7, d13→d15 | 256, 5 v, 3100 ns wide pulses |
| d0, d8→d12 | d1→d7, d13→d15 | one, 5 v, 3200 ns wide pulse and 255, 5 v, 3100 ns wide pulses |
| d0→d12 | d13→d15 | one, 5 v, 3100 ns wide pulse and 255, 5 v, 3200 ns wide pulses |
| d13 | d0→d12 & d14→d15 | 256, 5 v 3200 ns wide pulses |
| d0 & d13 | d1→d12 & d14→d15 | 255, 5 v 3200 ns wide pulses and one 5 v 3300 ns wide pulses |
| d14 | d0→d13 & d15 | 256, 5 v 6400 ns wide pulses |
| d0 & d14 | d1→d13 & d15 | 255 5 v 6400 ns wide pulses and one 5 v 6500 ns wide pulse |
| d15 | d0→d14 | 256, 5 v, 12.8 us pulses (256, 0 v,12.8 us slots) |
| d0, d15 | d1→d14 | 1, 5 v, 12.9 us pulse and 255, 5 v, 12.8 us pulses |
| d8, d15 | d0→d7, d8→d14 | 256, 5 v, 12.9 us pulses (256, 0 v,12.7 us slots) |
| d0, d8, d15 | d1→d7, d8→d14 | 1, 5 v, 13.0 us pulse and 255, 5 v, 12.9 us pulses |
| d9, d15 | d1→d8, | 256, 5 v, 13.0 us pulses |

TABLE 6-continued

| HIGH Input Data Bits | LOW Input Data Bits | BRM Output Pulse String Per D/C Word on Path 519 |
|---|---|---|
| d0, d9, d15 | d10→d14, d1→d8, d10→d14 | (256, 0 v, 12.6 pulses) 1, 5 v, 13.1 us pulse and 255, 5 v, 13.0 us pulses |
| d10, d15 | d0→d9 d11→d14 | 256, 5 v, 13.2 us pulses (256, 0 v,12.4 us slots) |
| d0, d10, d15 | d1→d9, d11→d14 | 1, 5 v, 13.3 us pulse and 265, 5 v, 13.2 us pulses |
| d11, d15 | d0→d10, d12→d14 | 256, 5 v, 13.6 us pulses (256, 0 v,12.0 us slots) |
| d12, d15 | d0→d11 d13→d14 | 256, 5 v, 14.4 us pulses (256, 0 v,11.2 us slots) |
| d13, d15 | d0→d12, d14 | 256, 5 v, 16.0 us pulses (256, 0 v, 8.6 us slots) |
| d14, d15 | d0→d13 | 256, 5 v, 19.2 us pulses (256, 0 v, 6.4 us slots) |
| d8, d14 d15 | d0→d7, d8→d13 | 256, 5 v, 19.3 us pulses (256, 0 v, 6.3 us slots) |
| d9, d14, d15 | d0→d8, d10→d13 | 256, 5 v, 19.4 us pulses (256, 0 v, 6.2 us slots) |
| d10, d14 d15 | d0→d8, d11→d13 | 256, 5 v, 19.6 us pulses (256, 0 v, 6.0 us slots) |
| d8→d15 | d0→d7 | 256, 5 v, 25.5 us pulses (256, 0 v, 100 ns slots) |
| d0, d8→d15 | d1→d7 | 1, 5 v, 51.1 us pulse and 254, 5 v, 25.5 us pulses (255, 0 v, 100 ns slots) |
| d1, d8→d15 | d0, d2→d7 | 2, 5 v, 51.1 us pulses and 252, 5 v, 25.5 us pulses (254, 0 v, 100 ns slots) |
| d0→d1, d8→d15 | d2→d7 | 3, 5 v, 51.1 us pulses 250, 5 v, 25.5 us pulses (253, 0 v, 100 ns slots) |
| d7→d15 | d0→d6 | 128, 5 v, 51.1 us pulses (128, 0 v, 100 ns slots) |
| d6→d15 | d0→d5 | 64, 5 v, 102.3 us pulses (64, 0 v, 100 ns slots) |
| d5→d15 | d0→d4 | 32, 5 v, 204.7 us pulses (32, 0 v, 100 ns slots) |
| d4→d15 | d0→d3 | 16, 5 v, 409.5 us pulses (16, 0 v, 100 ns slots) |
| d3→d15 | d0→d2 | 8, 5 v, 819.1 us pulses (8, 0 v, 100 ns slots) |
| d2→d15 | d0→d1 | 4, 5 v, 1.83830 ms pulses (4, 0 v, 100 ns slots) |
| d1→d15 | d0 | 2, 5 v, 3.27670 ms pulses (2, 0 v, 100 ns slots) |
| d0→d15 | none | 1, 5 v, 6.55350 ms pulse (1, 0 v, 100 ns slot) |

With all data bits HIGH, the pulse streams that result as the data bits are decremented by 1-LSB at each decrement of seven decrements are as follows:

| HIGH Input Data Bits | LOW Input Data Bits | BRM Output Pulse String Per D/C Word on Path 519 |
|---|---|---|
| d1→d15 | d0 | two, 5 v 3276700 ns wide pulses and two, 0 v 100 ns wide pulses |
| d0 & d2→d15 | d1 | one, 5 v, 3276700 ns wide pulses and two, 5 v, 1638300 ns wide pulses (three, 0 v, 100 ns pulses) |
| d2→d15 | d0→d1 | four, 5 v, 1638300 ns wide pulses (four, 0 v, 100 ns wide pulses) |
| d0→d1, d3→d15 | d2 | two, 5 v, 819100 ns wide pulses and three, 5 v, 1638300 ns wide pulses (5, 0 v, 100 ns wide pulses) |
| d1, d3→d15 | d0→d2 | four, 5 v, 819100 ns wide pulses and 2, 5 v, 1638300 ns wide pulses (6, 0 v, 100 ns wide pulses) |
| d0, d3→d15 | d1→d2 | six, 5 v, 819100 ns wide pulses and one 5 v, 1638300 ns wide pulses (7, 0 v, 100 ns wide pulses) |
| d3→d15 | d0→d2 | eight, 5 v, 819100 ns wide pulses (8, 0 v, 100 ns wide pulses) |

FIG. 12 and Table 6 each characterized the pulse waveform on path 519 in response to the reception of various patterns of data bits applied to input conductor 122. The general rule to use to derive the pulse pattern (when 16 bits of data are used) for bit patterns not shown on FIG. 12 or Table 6 is that each increment of 1 in the LSB value of the input data bits from d8 only high through d8 through d15 high causes an increase in pulse width of one pulse by 100 nanoseconds. Thus, with reference to Table 6, it is specifically indicated that data bit d8 only being high produces 256 100 nanosecond wide output pulses. The next entry on the table indicates that when only data bits d0 and d8 ae high, the output pulse pattern comprises 255 100 nanosecond pulses and one 200 nanosecond wide pulse. Another increment of 1 in the binary LSB value would result in bits d1 and d8 only being high and would generate 254 100 nanosecond pulses and two 200 nanosecond wide pulses. Similarly, further increments of 1 in the binary LSB value generate a pulse pattern having one less 100 nanosecond pulse and one extra 200 nanosecond pulse for each LSB increment of 1. This occurs until the bit vale increases so that only bit d9 is high. At this time, as is shown on Table 6, the output is then 256 200 nanosecond wide pulses. By similar analysis and by an understanding of the above-specified relationship, the output pulse patterns may be derived in a similar manner for other combinations of data bits input above and beyond those specifically shown in Table 6.

The last entry on table 6 indicates that when all data bits are high, the output pulse pattern comprises one 5 v 6553500 nanosecond wide pulse. This is shown also on line 1206 in FIG. 12. The output pulse pattern that generated in response to decrements from the all data bits high condition may be derived by use of the rule that each decrement of one LSB count causes an additional 100 NS negative slot and a resulting additional pulse in the output stream. Thus, a decrement of one LSB from the all data bits high condition generates an output stream having two 5 volt output pulses each of which would have a width in nanoseconds of 3276700. A further decrement of 1 would generate an additional negative 100 NS slot and two 5 volt output pulses each having a width in nanoseconds of 1638300 and one 5 volt pulse 3276700 ns wide. Each further decrement in value would generate an extra 100 nanosecond negative slot and an additional pulse in the output stream. The pulse pattern on a path 519 may also be derived mathematically by use of the priorly described Boolean expressions or the output of the BRM element on FIG. 8 of path 519 at the output of NOR gate 86.

The following summarizes the operation of the binary rate modulator for an n bit data sytem where m data bits ($0 < m < n$) rate modulate and n-m data bits width modulate. Data bits d0 through d(m-1) give rate modulation and data bits dm thru d(n-1) give width modulation. Enable bits E0 thru E(n-1) are generated by the binary rate modulator enable generator. Enable bits E(n-1) down thru E(n-m) are used to rate modulate data bits d0 thru d(m-1). Enable bit E(n-1) is combined in the binary rate modulator with data bit d0* to generate an output rate modulated pulse that occurs least often in the output word. Enable bit E(n-2) is combined in the binary rate modulator with data bit d1* to generate the output rate modulated pulse that occurs next to least often in the output word. This process continues so that:

E(n-3) is combined with d2*
E(n-4) is combined with d3*
E(n-5) is combined with d4* up until enable bit E(n-m) is combined with data bit d(m-1) in the binary rate multiplier to generate the output rate modulated pulse that occurs most often in the output word.

Enable word $$E0E1E2 \cdots E\left(\frac{n-m}{4} + 1\right)$$

is binary magnitude compared with data word $$dmdm+1dm+2 \cdots d\left(m + \frac{n-m}{4} + 1\right)$$

to give width modulation by data bits dm up thru $$d\left(m + \frac{n-m}{4} + 1\right).$$

Enable word $$E\left(\frac{n-m}{4} + 2\right)E\left(\frac{n-m}{4} + 3\right)E\left(\frac{n-m}{4} + 4\right) \cdots E(m-1)$$

is binary magnitude compared with data word $$d\left(m + \frac{n-m}{4} + 2\right)d\left(m + \frac{n-m}{4} + 3\right)d\left(m + \frac{n-m}{4} + 4\right) \cdots d(n-1)$$

to give width data bits $$d\left(m + \frac{n-m}{4} + 2\right)$$

up thru d(n-1).

When all data words are less than each compared enable word, no width modulation occurs. When all data words are greater than each compared enable word, maximum width modulation occurs. When data bit dm only (out of data bits dm up thru dn-1) is greater than enable bit E0, minimum width modulation occurs. Intermediate width modulation occurs for all other cases of data word binary magnitude comparisons with enable words.

Summarizing, for width modulation, the BRM output on path 519 is high when d(n-1)d(n-2)d(n-3) ---dm> E(n-m-1)E(n-m-2)E(n-m-3) --- E0.

On FIG. 5, the output of each section of BRM element 516 is clocked through the corresponding section of the DQ flip flops 517 by the DACCLK*/2 pulse on path 511. The DQ flip flops 517 are of the clocked type in that the state of the D input of each flip flop is clocked through to its Q output when ever a rising edge clock signal on path 511 is applied to the C input of the flip flop. The clock signals on path 511 have a precise 50% duty cycle. This is not necessary but provides the maximum digital signal processing time. These DQ flip flops provide the very precise output width control of the output pulses.

With the above-described relationships, a BRM 516 section applies a serial pulse stream over its associated output conductor 519 to the D input of its associated section of flip flop 517. The pulses of the stream are gated through the flip flop by rising edge clock signals on the C input of the flip flop. The Q* output of the flip flop is used as an output which is applied to an associated conductor 125. The different sections of flip flops 517 drive the different associated sections of interface circuit 104 which provide Q* output signals on paths 125. The output on each path 125 is the logical inverse of the combined rate/width modulated signal on path 519.

The timing and control signals used in the circuitry of the present invention eliminate the critical timing requirements of the priorly known indirect D/A converters. For example, the aforementioned D/A converters disclosed by H. Schmid require extremely close signal timing and circuit signal propagation characteristics in order to function properly. Contraywise, the circuitry embodying the present invention does not require either critical circuit timing or critical circuit propagation characteristics. This may be seen from a study of FIGS. 5, 6 and 7 together with FIG. 14 which shows the timing signal on line 121, the timing signal on line 602 and the timing signal on line 511.

The DACCLK clock signal is a 20 MHZ signal and it is applied over conductor 121 to the input of flip flop 604 which divides the frequency of the signal by two and applies the divided signal to its Q* and Q outputs. The Q* output is applied over path 511 to the C (clock) input of flip flops 517. The Q output of flip flop 604 is applied over path 602 to the C (clock) input of each section of the binary synchronous sixteen section counter 504. The signal on 511 is shown on line 1403 of FIG. 14 and it has a precision fifty percent duty cycle. The signal on path 121 is shown on line 1401 and the signal on path 602 is shown on line 1402. The signal on path 511 is effective only on its rising edge, such as at times T2 and T6 on FIG. 14. At such times, the rising edge of the 511 signal clocks through each flip flop 517 the potential currently on its D input to it Q output and the inverse signal to its Q* output. The 511 signal has no affect on flip flops 517 at other times.

Recall from a prior description that each counting pulse applied over path 602 to the clock input of each section of counter 504 causes the counter to increment one position. Since this is a sixteen bit counter, it has 65536 counting positions and the time required for the counter to cycle through all of its positions in response to pulses on path 602 is 6.5536 milliseconds. This figure also represents the length of time that may be required for the associated BRM element 516 to process a received data word and apply a maximum of 256 pulses to its output conductor 519. The conductor 519 signal is applied to the D input of the associated flip flop 517.

Although it may take up to 6.5536 milliseconds for all of the pulses representing a received word to be applied by the BRM element 516 to the D input of a flip flop 517, the flip flop receives a rising edge signal on path 511 once each time that counter 504 increments in response to a pulse on path 602. Therefore, a single pulse on path 519 from the BRM element may be of sufficient width so that the high signal on path 519 representing the pulse will be strobed from the D input to the Q* output of the flip flop many times during the persistence of the pulse on path 519. This is of no concern since the flip flop output does not change state during this period and the high signal on its D input will be strobed through the flip flop and appear as a low signal on its Q* output on path 125. This signal on path 125 does not have the same width as does the input signal on path 519. The width of the signals on line 125 are precisely controlled by the 511 clock signal.

The data bits on path 122 and the DCLK clock signals on path 124 can be received at a 20 MHZ rate if desired. Since there may be 20 bits in a word including the address bits, the 20 bit word may be clocked into the register rapidly. However, elements 116 through 119 on FIG. 1, which generate the data bits and the clock signals, may be a microprocessor which controls the rate at which words are entered into the shift register 501. A high throughput of data words is not a requirement and therefore data words may be applied to path 122 at a relatively slow rate compared to the rate at which counter 504 cycles. In other words, it takes counter 504 approximately 6.553 milliseconds (when a 20 MHZ clock is received on path 121) to cycle through all of its positions so that the associated BRM element can generate all of the pulses that the required on path 519 to represent the received digital word. Conceivably, words could be entered into shift register 501 at such a rate that there would be a new word at the input of each of the sixteen BRM sections once every 6.5536 milliseconds. However, a data throughput of this magnitude is not required and a new word may be applied to each BRM section at a far slower rate.

A word in the shift register 501 is transferred from the shift register to latch 514 by the DL* signal on path 123. The word remains in the latch indefinitely until the same latch section receives a subsequent word. Since this may not happen for an extended period of time, a word stored in the latch may remain there for a prolonged period of time and applied out from the latch over path 518 for a comparable prolonged period of time to the associated BRM element 516. Once every 6.553 milliseconds counter 504 cycles through all of its positions and the associated BRM element generates all of the pulses required to represent the word applied to its input. This train of pulses is applied to the D input of the associated flip flop which is clocked at a 10 MHZ rate (when a 20 MHZ clock is used on line 121) by conductor 511 so that the inverse of the pulse train appears on path 125. This pulse train on path 125 is repeated once again each subsequent 6.5536 interval that the same word remains applied to the BRM.

The modulated pulse train on path 125 is extended through interface 104 and over path 126 to the associated filter section which integrates the pulse train and converts it to a steady state analog voltage. The presence of a word in a section of latch 514 for a prolonged period of time causes the BRM element to generate a repetitive series of pulse trains representing the word. The associated filter section receives this repetitive pulse train and maintains a steady state signal at its output with the amplitude of the signal output remaining constant for the duration of time that the word remains in latch 514. In other words, once a word is entered into latch 514, the associated filter section generates an output signal which remains at a constant amplitude for the duration of time that the word remains in path 514. The output of the filter section does not change until the binary value of the word in the associated latch 514 changes.

Figure 14:
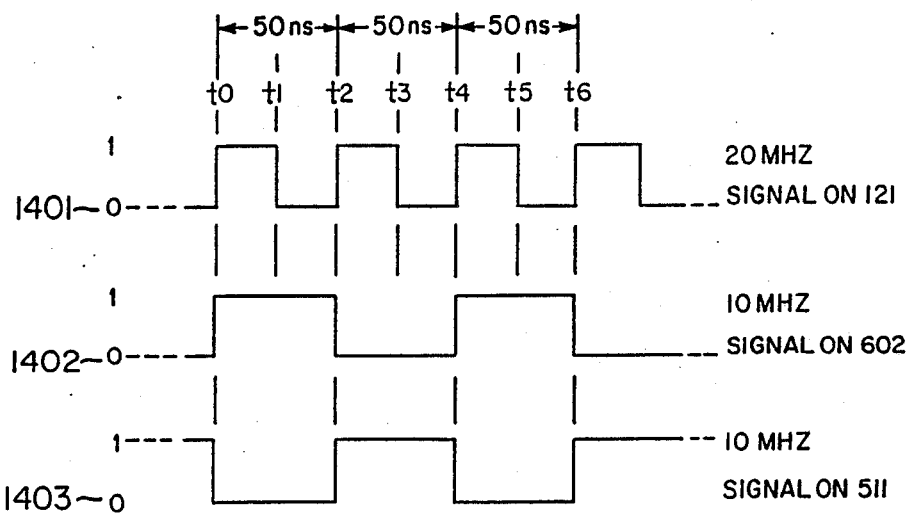
FIG. 14 illustrates the signals on conductors 121, 602 and 511.

With regard to FIG. 14, at time T0, the rising edge of the signal on path 602 increments counter 504. In the time interval between T0 and T2 all digital signal processing is completed in the binary counter 504, in the enable generator 505 and in the BRM element 516 and an appropriate logic level is on path 519 from the BRM is waiting to be clocked into flip flop 517. At time T2, the rising edge of the signal on path 511 clocks the signal on path 519 into flip flops 517. At time T4, the rising edge of the 602 signal again increments counter 504. In the time interval between T4 and T6, all digital signal processing is again completed in the binary counter 504, in the enable generator 505 and in the BRM element 516 and an appropriate logic level is once again on path 519 waiting to be clocked through flip flops 517. The signal on path 519 may or may not be the same at time T4 as it was at time T2. In many cases it will be the same, in many cases it will be different. At time T6, the rising edge of the 511 signal again clocks the signal on path 519 through to the output of flip flop 517. This process continues and creates a pulse string representing the received word out on path 106 that is representative of the data bits loaded into latch 514.

Note that the E-data bits on FIGS. 6 & 7 are generated at different times after their associated counter sections change states due to signal propagation delays through the various gates. This causes the BRM to generate pulses whose widths have an inaccuracy due to the different propagation delays to FIGS. 6 & 7. The output pulses on paths 519 extending to the D-inputs of the flip flops 517 have the same width inaccuracies. However the strobing of the flip flops by the path 511 clock signal causes an output signal pulse to be extended to the Q* output and path 125 that does not have the width inaccuracies.

It may be seen from the foregoing that the timing of the circuitry of the present invention is such that it is not critical and does not rely for successful circuit operation upon precise propagation times in the employed circuitry.

A data word may be transferred from shift register 501 to a latch section 518 immediately prior to the occurrence of a rising edge signal on path 511. This may generate a meaningless signal through to be strobed through flip flops 517. However, this only occurs for a maximum of one cycle of counter 504. This is no consequence since this signal is smoothed out by the associated filters which have a much longer time constant. Thus, the generation of a transient by BRM 516 as a new word is received close to a positive rising edge on path 511 produces no transient in the output of the associated filter.

If desired, the number of channels of the disclosed converter can be changed from 16 by changing the size of the output address decoder, changing the number of sections in data latches 514 and changing the number of sections in binary rate multiplier 516, changing the number of DQ flip flops 517 and changing the number of sections in interface 104.

A 16 bit wide system is described. If desired, the number of data bits per channel can be changed by changing the size of shift register 501, changing the size of each data latch 514, changing the number of elements in BRM 516 and changing the size of the synchronous binary counter 504 and the binary rate enable multiplier generator 505.

The design of the above-described circuitry can be easily modified to generate either a full rate modulated or a full width modulated pulse output string. If the BRM element of FIG. 8 were to be combined with the upper 8 data bits with the lower 8 BRM enable pulses in a straight binary rate multiplier (the same as the lower 8 data bits are combined with the upper 8 BRM enable pulses), the output of the BRM multiplier would be a full rate modulated pulse string. If the BRM element of FIG. 8 were combined with the lower 8 bits of the upper 8 enable pulses in two additional four bit magnitude comparators (similar to the way that the upper 8 data bits are combined with the lower 8 BRM enable pulses), then the final output of the binary rate multiplier would be a full width modulated pulse string.

In summary of the operation of FIG. 5, words are received serially by shift register 501, stored by the shift register, and read out of it in parallel by the DL* signal. The D- bits in the shift register are applied in parallel to the corresponding section of latch 514 under control of the A- address bits in the received word. Latch 514 stores the received data bits. The stored bits are applied out of the data latch in parallel over one of paths 518 to a corresponding section of the BRM element 516. On FIG. 8, all D- bits (or their inverse) of the received data word are applied to the D- inputs of the BRM element while the enable pulses on the E- lead are applied to the E- inputs of FIG. 8. This causes the data bits on the D- inputs of FIG. 8 to be converted to a rate/width modulated pulse stream which is applied to the output path 519 of FIG. 8. This pulse stream is applied to the DQ flip flops of element 517 as a serial stream. The Q* output of the flip flop represents a corresponding inverse serial stream which is applied through interface 104 to the appropriate channel output on a path 106 of FIG. 5. The output signal on path 106 is applied to either to voltage stabilizer 102-0 or to a corresponding filter section 102-1 through 102-15 as shown on FIG. 1. The filter section smoothes out the rate/width modulated pulse stream and integrates it to provide a steady state signal having an amplitude indicative of the binary value of the received data word.

The output voltage stabilizer 102-0 senses the output of D/A converter channel 0 on path 106-0 and through a high gain negative feedback loop, regulates the positive supply on path 113-0. This output stabilizer plays a major role in setting and maintaining a high accuracy of the output signal generated by the D/A converter. The following describes how the voltage stabilizer is calibrated. With hardware calibration, a fixed data load is loaded into the control channel 0 via path 122. Potentiometer 126 controls the input voltage to the stabilizer. A reference channel, such as channel 1, is loaded with all data bits high and the filter output from this reference channel 102-1 on path 113-1 is monitored with a high accuracy digital voltmeter. The potentiometer slider 127 is varied to cause the voltage of the reference channel 102-1 to read plus 5 volts d.c. on path 113-1. The reference channel is reloaded with all data bits low and the reading of the volt meter on path 113-1 is observed. Step 1 is repeated and the output on path 113-1 is adjusted by changing potentiometer slider 127 to read the plus 5 volts plus the voltage read on path 113-1 with all data bits low.

When one stabilizer circuit is used, the overall converter gives an approximate 0 to plus 5 volt output that may be slightly offset from 0 and plus 5 volts. This offset is quite small and is in the order of microvolts. This arrangement gives an exact 5 volt swing of the output signal. This is normally of no consequence in many applications where less than 16 data bits are used. If it is desirable to obtain an accurate absolute 0 to plus 5 volts output voltage, a second stabilizer circuit can be used to apply a regulated virtual ground. This requires the dedication of a second channel of the converter. This second channel is then calibrated for a 0 output on the virtual ground in the same manner as described for the calibration of the output of channel 0 to 5 volts.

A typical operating cycle from power-up after the circuit is calibrated is as follows:

(1) The initial or resting input signal conditions are:

| (1) The initial or resting input signal conditions are: | |
|---|---|
| DACCLK | running |
| DLN | HIGH |
| DATA | don't care |
| DCLK | HIGH |

(2) At each power-up, shift register 501 is cleared by writing the first data and address twice. (Repeat steps 3 and 4 below twice). This step is not required again until the instrument is powered down and then subsequently powered up. It is also not required if the first channel to be loaded after power-up is loaded with 16 bits of data plus the channel 0 address bits.

(3) Data bits followed by four A- address bits are shifted into shift register 501 by the DCLK pulses. After all data and address bits are shifted in for any channel, the DCLK signal must be left in the HIGH state.

(4) The DL* signal is cycled one time per received word. This latches the data bits into the appropriate section of data latch 514 as directed by the A- address bits on path 507. It also prepares shift register 501 to be cleared before shifting another word on path 122. The DL* signal must remain in the HIGH state after entering data into latch 514. With the DACCLK* signal running, an output is continuously produced a path 106-. Steps 3 and 4 are repeated for each channel used.

(5) The first D/A channel loaded with data after each power up is always Channel 0. This controls the Output Voltage Stabilizer circuit 102 which sets the +V voltage to Interface 104. Any channel may be used as the Control Channel if one does not wish to use channel 0.

The +5 volt stabilizer is always connected to the control channel.

While a specific embodiment of this invention has been disclosed herein, it is expected that those skilled in the art can design other embodiments that differ from this particular embodiment but fall within the scope of the appended claims. For example, clock rates other than those shown herein could be used. Also, other rate/width modulation combinations could be used, such as 64 rate modulation pulses instead of 256.

We claim:

1. Apparatus for generating a rate/width modulated pulse signal on an output in response to the reception of n data bits on an input, said apparatus comprising;
   means responsive to the receipt by said input of m bits of said n data bits, where m and n are integers and where m is less than n, for generating a rate modulated output signal having a number of pulses determined by the binary value of said m bits,
   means responsive to the receipt by said input of the additional ones of said n bits beyond said m bits for generating a width modulated output pulse signal, and
   means for combining said rate modulated output signal and said width modulated output pulse signal to produce said rate/width modulated output signal having a variable number of pulses which increase in width under control of the binary value of said additional bits.

2. Apparatus for generating a rate/width modulated pulse signal on an output in response to the reception of n data bits on an input, said apparatus comprising;
   means responsive to the receipt by said input of m bits of said n data bits, where m and n are integers and where m is less than n, for generating a rate modulated output signal having a number of pulses equal in number to the binary value of said m bits,
   means responsive to the receipt by said input of the additional ones of said n bits beyond said m bits for generating a width modulated output pulse signal, and
   means for combining said rate modulated output signal and said width modulated output pulse signal to produce said rate/width modulated signal having a variable number of pulses whose width is determined by the binary value of said additional bits.

3. The apparatus of claim 2 wherein the number of pulses comprising said rate/width modulated output signal can vary from a maximum determined by the maximum binary value of said m bits down to a minimum of 1 depending upon the binary value of said additional input bits.

4. The apparatus of claim 2 wherein said means for generating said rate modulated output signal comprises:
   means for detecting each least significant bit increase in said binary value of said m bits, and
   means for generating an additional rate modulated output pulse in response to each detected least significant bit increase.

5. The apparatus of claim 2 wherein said means for generating said width modulated output signal comprises:
   means for detecting each least significant bit increase in the binary value of said additional bits, and
   means for increasing the width of one of said pulses of said width modulated pulse signal by a predetermined amount for each detected least significant bit increase in the binary value of said additional bits.

6. Apparatus for generating a rate/width modulated pulse signal on an output, said apparatus comprising;
   a data source,
   an input for receiving n data bits from said data source,
   means responsive to the receipt by said input of the lower order m bits of said n bits, where m is less than n and where m and n are integers, for generating a rate modulated output signal having a number of pulses equal to the binary value of said lower order m bits,
   means responsive to the reception of the additional ones of said n bits beyond said m bits for generating a width modulated output pulse signal, and
   means for combining said rate modulated output signal and said width modulated output signal to produce said combined rate/width modulated output signal having a variable number of pulses at least one of whose width is incremented a predetermined amount for each least significant bit increase in the binary value of said additional bits.

7. The apparatus of claim 6 wherein said means for generating said rate modulated output signal comprises:
   means for detecting each least significant bit increase in said binary value of said m bits, and
   means for generating an additional rate modulated output pulse in said rate modulated output signal in response to each detected least significant bit increase.

8. The apparatus of claim 6 wherein said means responsive to the reception of said additional bits comprises:
   means for detecting each least significant bit increase in the binary value of said additional bits, and
   means for increasing the width of one of said pulses of said width modulated pulse signal by a predetermined amount for each detected least significant bit increase in the binary value of said additional bits.

9. Apparatus for generating a rate/width modulated pulse signal, said apparatus comprising;
   an n bit data source,
   means for generating a clock signal,
   a binary rate multiplier,
   data inputs on said binary rate multiplier,
   enable inputs on said binary rate multiplier,
   a binary rate multiplier enable generator,
   a binary counter,
   means for applying said clock signal to said counter,
   means for operating said counter in response to said application of said clock signal to apply binary enable signals to said enable inputs of said binary rate multiplier,
   means for applying n data bits from said data source to said data inputs on said binary rate multiplier,
   rate modulation means in said binary rate multiplier responsive to the receipt of said enable signals and of the lower order m bits of said n data bits for generating a rate modulated output signal having a number of pulses equal to the binary value of said m bits, and
   width modulation means in said binary rate multiplier responsive to the reception of said enable signals and of the additional ones of said n bits beyond said m bits for generating said rate/width modulated output pulse signal in which said pulses generated according to the binary value of said m bits are increased in width under control of the binary value of said additional bits.

10. The apparatus of claim 9 wherein said means for generating said rate modulated output signal comprises:
means for detecting each least significant bit increase in said binary value of said m bits, and
means for generating an additional output pulse in said rate modulated output signal in response to each detected least significant bit increase.

11. The apparatus of claim 10 wherein said means responsive to the receipt of said additional bits comprises:
means for detecting each least significant bit increase in the binary value of said additional bits, and
means for increasing the width of one of said pulses of said rate/width modulated signal by a predetermined amount for each detected least significant bit increase in the binary value of said additional bits.

12. The apparatus of claim 9 wherein said apparatus further comprises:
means for generating an inverse clock signal having transitions at predetermined intervals,
a flip flop,
a data input on said flip flop,
a clock input on said flip flop,
means for applying said output of said binary rate multiplier to said data input of said flip flop, and
means for applying said inverse clock signal to said clock input of said flip flop,
said flip flop being responsive to the concurrent receipt of said inverse clock signal and said output signal of said binary rate multiplier to apply to an output of said flip flop a signal that changes logical state only at intervals determined by transitions of said inverse clock signal applied to said flip flop.

13. The apparatus of claim 12 wherein said means for generating an inverse clock signal comprises:
a master clock source for generating a master clock signal,
a divider, and
means for extending said master clock signal from said source to said divider, said divider being responsive to said receipt of said master clock signal for dividing said master clock signal to generate said inverse clock signal.

14. The apparatus of claim 9 wherein said means for applying said n data bits to said binary rate multiplier comprises:
means for applying the logical inverse of the lower order m bits of said n data bits to said binary rate multiplier, and
means for applying the additional ones beyond m bits of said n bits to said binary rate multiplier in non-inverted form.

15. The apparatus of claim 9 wherein said rate modulation means comprises:
means for receiving the logical inverse of each of said m data bits,
means for receiving the m higher ordered ones of said enable signals, and
means for associating each said inverse of each of said m data bits with one of said m highest enable signals in an inverse sequential order so that said lowest ordered inverse data bit is associated with the highest ordered enable signal and so that the highest ordered inverse data bit is associated with the lowest ordered one of said m enable signals.

16. The apparatus of claim 15 wherein said width modulation means comprises:
a first and a second magnitude comparator,
means for applying the higher ordered n-m data bits to a first set of inputs of said comparators,
means for applying the lower ordered m enable bits to a second set of inputs on said comparators,
said comparators being responsive to the concurrent reception of said data bits and said enable bits to generate width modulated output pulse signals.

17. A method of operating apparatus for generating a rate/width modulated pulse signal on an output in response to the reception of n data bits on an input, said method comprising the steps of:
responding to the receipt by said input of m bits of said n data bits, where m and n are integers and where m is less than n, for generating a rate modulated output signal having a number of pulses determined by the binary value of said m bits,
responding to the receipt by said input of the additional ones of said n bits beyond said m bits for generating a width modulated output pulse signal, and
combining said rate modulated and said width modulated output signals to produce said rate/width modulated signal having a variable number of pulses which increase in width under control of the binary value of said additional bits.

18. A method of operating apparatus for generating a rate/width modulated pulse signal on an output in response to the reception of n data bits on an input, said method comprising the steps of:
responding to the receipt by said input of m bits of said n data bits, where m and n are integers and where m is less than n, for generating a rate modulated output signal having a number of pulses equal in number to the binary value of said m bits,
responding to the receipt by said input of the additional ones of said n bits beyond said m bits for generating a width modulated output pulse signal, and
combining said rate modulated and said width modulated output signals to produce said rate/width modulated pulse signal having a variable number of pulses whose width is determined by the binary value of said additional bits.

19. The apparatus of claim 18 wherein said pulses of said width modulated output signal can vary from a maximum determined by the maximum binary value of said m bits down to a minimum of 1 depending upon the binary value of said additional bits.

20. The method of claim 18 wherein said step of generating said rate modulated output signal comprises the steps of:
detecting each least significant bit increase in said binary value of said m bits, and
generating an additional output pulse in said rate modulated output signal in response to each detected least significant bit increase.

21. The method of claim 18 wherein said step of generating said width modulated output signal comprises the steps of:
detecting each least significant bit increase in the binary value of said additional bits,
and increasing the width of one of said pulses of said width modulated signal by a predetermined amount for each detected least significant bit increase in the binary value of said additional bits.

22. A method of operating apparatus for generating a rate/width modulated pulse signal said method comprising the steps of:

receiving n data bits on an input from a data source,
responding to the receipt by said input of the lower order m bits of said n data bits, where m and n are integers and where m is less than n, for generating a rate modulated output signal having a number of pulses equal to the binary value of said lower order m bits,
responding to the reception of the additional ones of said n data bits beyond said m bits for generating a width modulated output pulse signal, and
combining with said rate modulated output signal and said width modulated output signal to produce said rate/width modulated pulse signal having a variable number of pulses whose width is controlled by the binary value of said additional bits.

23. The method of claim 22 wherein said step of generating said rate modulated output signal comprises the steps of:
detecting each least significant bit increase in said binary value of said m bits, and
generating an additional output pulse in said rate modulated output signal in response to each detected least significant bit increase.

24. The method of claim 22 wherein said step of responding to the reception of said additional bits comprises the steps of:
detecting each least significant bit increase in the binary value of said additional bits, and
increasing the width of one of said pulses of said width modulated signal by a predetermined amount for each detected least significant bit increase in the binary value of said additional bits.

25. A method of operating apparatus for generating a rate/width modulated pulse signal, said method comprising the steps of:
generating a clock signal and an inverse clock signal;
applying said clock signal to a counter,
operating said counter in response to said application of said clock signal to apply binary words as enable signals from said counter to enable inputs of a binary rate multiplier,
applying n data bits from a data source to data inputs on said binary rate multiplier,
operating rate modulation means in said binary rate multiplier in response to the receipt of said enable signals and the lower order m data bits of said n data bits, where m and n are integers and where m is less than n, for generating a rate modulated output signal having a plurality of pulses equal in number to the binary value of said lower order m bits,
operating width modulation means in said binary rate multiplier in response to the reception of said enable signals and the additional ones of said n bits beyond said m bits for generating a width modulated output pulse signal, and
combining said rate modulated output signal and said width modulated output signal to generate said rate/width modulated signal having a variable number of pulses which increase in width under control of the binary value of said additional bits.

26. The method of claim 25 wherein said step of generating a rate modulated output signal comprises the steps of:
detecting each least significant bit increase in said binary value of said m bits, and
generating an additional output pulse in said rate modulated signal in response to each detected least significant bit increase.

27. The method of claim 26 wherein said step of responding to the receipt of said additional pulses comprises the steps of:
detecting each least significant bit increase in the binary value of said additional bits, and
increasing the width of one of said pulses of said rate/width modulated pulse signal by a predetermined amount for each detected least significant bit increase in the binary value of said additional bits.

28. The method of claim 25 wherein said method further comprises the steps of:
generating an inverse clock signal having transitions at predetermined intervals,
applying said output of said binary rate multiplier to a data input of a flip flop, and
applying said inverse clock signal to a clock input of said flip flop,
said flip flop being responsive to the concurrent receipt of said inverse clock signal and said output signal of said binary rate multiplier to apply to said output of said flip flop a signal that changes logical state only at intervals determined by transitions of said inverse clock signal applied to said flip flop.

29. The method of claim 28 wherein said step of generating an inverse clock signal comprises the steps of:
generating a master clock signal, and
extending said master clock signal to a divider, said divider being responsive to said receipt of said master clock signal to generate said inverse clock signal.

30. The method of claim 25 wherein said step of applying said data bits to said binary rate multiplier comprises the steps of:
applying the logical inverse of said lower order m bits of said n data bits to said binary rate multiplier, and
applying said additional ones of said n bits to said binary rate multiplier in non inverted form.

31. The method of claim 25 wherein said step of operating said rate modulation means comprises the steps of:
receiving the logical inverse of each of said m data bits,
receiving the m higher ordered ones of said enable signals, and
associating each said inverse of each of said m data bits with one of said m highest enable signals in an inverse sequential order so that the lowest ordered inverse data bit is associated with the highest ordered enable signal and so that the highest ordered inverse data bit is associated with the lowest ordered one of said m enable signals.

32. Apparatus for generating a rate/width modulated pulse signal on an output in response to the reception of n data bits on an input, said apparatus comprising;
means responsive to the receipt by said input of said n bits when said n bits have a binary value of 0 through $2^n-2^m$, where m and n are integers and where m is less than n, for generating a rate/width modulated output signal having a variable number of pulses determined by the binary value of said n bits and having a pulse width determined by the binary value of said n bits, and
means responsive to the receipt of said n bits when said n bits have a binary value in excess of $2^n-2^m$ for generating a rate/width modulated output signal having a decreasing number of pulses of increasing width for each increase in the binary value of said n bits beyond the value of $2^n-2^m$.

33. A method of operating apparatus for generating a rate/width modulated pulse signal on an output in response to the reception of n data bits on an input, said method comprising the steps of:

responding to the receipt by said input of said n bits when said bits have a binary value of 0 through $2^n-2^m$, where m and n are integers and where m is less than n, for generating a rate/width modulated output signal having a number of pulses determined by the binary value of said n bits and having a pulse width determined by the binary value of said n bits, and responding to the receipt of said n bits when said n bits have a binary value in excess of $2^n-2^m$ for generating a rate/width modulated output signal having a decreasing number of pulses of increasing width for each increase in the binary value of said n bits beyond the value of $2^n-2^m$.

34. Apparatus for generating a rate/width modulated pulse signal on an output in response to the reception of n data bits on an input, said apparatus comprising;

means responsive to the receipt by said input of said n bits when said n bits have a binary value of 0 through $2^m$, where m and n are integers and where m is less than n, for generating a rate/width modulated output signal having a variable number of pulses of a constant minimum width with the number of pulses being comprising said output signal being determined by the binary value of said n bits, means responsive to the receipt of said n bits when said n bits have a binary value in excess of $2^m$ and not exceeding $2^n-2^m$ for generating a rate/width modulated output signal having a constant number of pulses whose width is controlled by the binary value of said n bits, and means responsive to the receipt of said n bits when said n bits have a binary value in excess of $2^n-2^m$ for generating a rate/width modulated output signal having a decreasing number of pulses of increasing width for each increase in the binary value of said n bits beyond the value of $2^n-2^m$.

35. A method of operating apparatus for generating a rate/width modulated pulse signal on an output in response to the reception of n data bits on an input, said method comprising the steps of:

responding to the receipt by said input of said n bits when said n bits have a binary value of 0 through $2^m$, where m and n are integers and where m is less than n, for generating a rate/width modulated output signal having a variable number of pulses of a constant width with the number of said pulses comprising said output signal being determined by the binary value of said n bits, responding to the receipt of said n data bits when said n bits have a binary value in excess of $2^m$ and not exceeding $2^n-2^m$ for generating a rate/width modulated output signal having a constant number of pulses whose width is controlled by the binary value of said n bits, and responding to the receipt of said n bits when said n bits have a binary value in excess of $2^n-2^m$ for generating a rate/width modulated output signal having a decreasing number of pulses of increasing width for each increase in the binary value of said n bits beyond the value of $2^n-2^m$.

* * * * *